US012581855B2

(12) United States Patent
Kim et al.

(10) Patent No.: US 12,581,855 B2
(45) Date of Patent: Mar. 17, 2026

(54) THERMOELECTRIC MODULE

(71) Applicant: LG INNOTEK CO., LTD., Seoul (KR)

(72) Inventors: Jong Hyun Kim, Seoul (KR); Young Sam Yoo, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 294 days.

(21) Appl. No.: 18/010,584

(22) PCT Filed: Jul. 22, 2021

(86) PCT No.: PCT/KR2021/009478
§ 371 (c)(1),
(2) Date: Dec. 15, 2022

(87) PCT Pub. No.: WO2022/019673
PCT Pub. Date: Jan. 27, 2022

(65) Prior Publication Data
US 2023/0263059 A1　Aug. 17, 2023

(30) Foreign Application Priority Data

Jul. 24, 2020　(KR) ........................ 10-2020-0092507
Jan. 13, 2021　(KR) ........................ 10-2021-0004620

(51) Int. Cl.
*H10N 10/13*　(2023.01)
*H10N 10/17*　(2023.01)
*H10N 10/81*　(2023.01)
(52) U.S. Cl.
CPC ............. *H10N 10/13* (2023.02); *H10N 10/17* (2023.02); *H10N 10/81* (2023.02)

(58) Field of Classification Search
None
See application file for complete search history.

(56) References Cited

U.S. PATENT DOCUMENTS

2008/0023058 A1　1/2008　Ito et al.
2012/0057305 A1*　3/2012　Morisaku ............... H10N 10/13
361/720
(Continued)

FOREIGN PATENT DOCUMENTS

EP　　　2945198　　11/2015
JP　　H05-175556　　7/1993
(Continued)

OTHER PUBLICATIONS

English language machine translation of JP-2011216517-A (Year: 2025).*

(Continued)

*Primary Examiner* — Eli S Mekhlin
(74) *Attorney, Agent, or Firm* — KED & ASSOCIATES, LLP

(57) ABSTRACT

A thermoelectric module according to an embodiment of the present invention comprises: a first substrate; a first electrode disposed on the first substrate; a semiconductor structure disposed on the first electrode; a second electrode disposed on the semiconductor structure; a second substrate disposed on the second electrode; and a heat sink disposed on the second substrate, wherein the heat sink includes a protrusion portion disposed on at least one surface of a path through which a fluid passes.

12 Claims, 21 Drawing Sheets

(56) References Cited

U.S. PATENT DOCUMENTS

| | | | |
|---|---|---|---|
| 2015/0330677 A1* | 11/2015 | Shin | F25B 21/02 |
| | | | 62/3.3 |
| 2019/0078857 A1* | 3/2019 | Vergara | H10N 10/853 |

FOREIGN PATENT DOCUMENTS

| | | |
|---|---|---|
| JP | 2006-121006 | 5/2006 |
| JP | 2006-156818 | 6/2006 |
| JP | 2006-179843 | 7/2006 |
| JP | 2007-123564 | 5/2007 |
| JP | 2008-066663 | 3/2008 |
| JP | 2008-078222 | 4/2008 |
| JP | 2008-288330 | 11/2008 |
| JP | 2009-135524 | 6/2009 |
| JP | 2011-216517 | 10/2011 |
| JP | 2011216517 A * | 10/2011 |
| JP | 2012-199356 | 10/2012 |
| KR | 10-2015-0130169 | 11/2015 |
| WO | WO 2013/002423 | 1/2013 |
| WO | WO 2019/194595 | 4/2019 |

OTHER PUBLICATIONS

International Search Report dated Oct. 22, 2021 issued in Application No. PCT/KR2021/009478.

European Search Report dated Nov. 16, 2023 issued in Application No. 21845493.2.

Japanese Office Action dated Nov. 5, 2024 issued in Application No. 2023-503169.

Japanese Office Action dated May 7, 2025, issued in Application No. 2023-503169.

Korean Office Action dated Jul. 24, 2025, issued in Application No. 10-2021-0004620.

* cited by examiner

THIRD DIRECTION

SECOND DIRECTION

FIRST DIRECTION

200f:201, 202, 203, 204

THIRD DIRECTION

FIRST DIRECTION    SECOND DIRECTION

THIRD DIRECTION

FIRST DIRECTION     SECOND DIRECTION

FIRST DIRECTION

THIRD DIRECTION

FIRST DIRECTION     SECOND DIRECTION

THIRD DIRECTION

FIRST DIRECTION ← → SECOND DIRECTION

THIRD DIRECTION

FIRST DIRECTION    SECOND DIRECTION

THIRD DIRECTION

FIRST DIRECTION    SECOND DIRECTION

THIRD DIRECTION

FIRST DIRECTION          SECOND DIRECTION

200 : 210, 220

THIRD DIRECTION

FIRST DIRECTION          SECOND DIRECTION

200 : 210, 220

THIRD DIRECTION

FIRST DIRECTION ← → SECOND DIRECTION

200 : 210, 220

THIRD DIRECTION

FIRST DIRECTION ← → SECOND DIRECTION

FIRST DIRECTION

THIRD DIRECTION
SECOND DIRECTION

FIG. 28

FIRST DIRECTION

THIRD DIRECTION

SECOND DIRECTION

1200 : 1200-1, 1200-2
1300 : 1300-1, 1300-2
200 : 210, 220

THERMOELECTRIC MODULE

CROSS-REFERENCE TO RELATED PATENT APPLICATIONS

This application is a U.S. National Stage Application under 35 U.S.C. § 371 of PCT Application No. PCT/KR2021/009478, filed Jul. 22, 2021, which claims priority to Korean Patent Application Nos. 10-2020-0092507, filed Jul. 24, 2020 and 10-2021-0004620, filed Jan. 13, 2021, whose entire disclosures are hereby incorporated by reference.

TECHNICAL FIELD

The present invention relates to a thermoelectric module, and more specifically, to a heat sink of a thermoelectric element.

BACKGROUND ART

A thermoelectric phenomenon is a phenomenon which occurs due to movement of electrons and holes in a material and refers to direct energy conversion between heat and electricity.

A thermoelectric element is a generic term for an element using the thermoelectric phenomenon and has a structure in which a P-type thermoelectric material and an N-type thermoelectric material are joined between metal electrodes to form a PN junction pair.

Thermoelectric elements can be classified into an element using temperature changes of electrical resistance, an element using the Seebeck effect, which is a phenomenon in which an electromotive force is generated due to a temperature difference, an element using the Peltier effect, which is a phenomenon in which heat absorption or heat generation by current occurs, and the like.

The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, the thermoelectric legs are disposed between an upper substrate and a lower substrate, upper electrodes are disposed between the thermoelectric legs and the upper substrate, and lower electrodes are disposed between the thermoelectric legs and the lower substrate.

Meanwhile, a heat sink can be disposed on at least one of the upper substrate and the lower substrate of the thermoelectric element, and a fluid can pass through the heat sink. In this case, a flow velocity in a middle region of the heat sink can be greater than a flow velocity in an edge region, and as a moving distance of the fluid increases, a flow velocity difference between the middle region and the edge region may further increase. That is, an amount of heat exchange between the fluid and the heat sink can decrease as a distance from a fluid inlet increases.

DISCLOSURE

Technical Problem

The present invention is directed to providing a thermoelectric module having improved heat transfer performance between a substrate and a heat sink.

Technical Solution

A thermoelectric module according to one embodiment of the present invention includes: a first substrate; a first electrode disposed on the first substrate; a semiconductor structure disposed on the first electrode; a second electrode disposed on the semiconductor structure; a second substrate disposed on the second electrode; and a heat sink disposed on the second substrate, wherein the heat sink includes a protrusion disposed on at least one surface of a path through which a fluid passes.

The heat sink may have a shape in which predetermined patterns are connected while being regularly repeated, and the protrusion may be disposed on each of the patterns.

Each of the patterns may include a first surface disposed on the second substrate, a second surface connected to the first surface and disposed in a direction perpendicular to the second substrate, a third surface connected to the second surface and disposed to face the second substrate, and a fourth surface connected to the third surface, perpendicular to the second substrate, and disposed to face the second surface, a distance between the second substrate and the third surface may be greater than a distance between the second substrate and the first surface, each of the first surface, the second surface, the third surface, and the fourth surface may extend along a direction in which the fluid passes, and the protrusion may be disposed on at least one of the first surface, the second surface, the third surface, and the fourth surface.

The protrusion may be disposed in a region formed by the second surface, the third surface, the fourth surface, and the second substrate.

The protrusions may be disposed on the second surface and the fourth surface.

A length of the protrusion according to the direction in which the fluid passes may be 4 to 10% of a length of each of the second surface and the fourth surface, a thickness of the protrusion according to a direction perpendicular to the direction in which the fluid passes and parallel to the second substrate may be 10 to 20% of a distance between the second surface and the fourth surface, and a height of the protrusion according to a direction perpendicular to the second substrate may be 30 to 50% of a distance between the second substrate and the third surface.

The thickness of the protrusion may decrease along the direction in which the fluid passes.

The protrusion may be disposed to be spaced apart from the second substrate.

The protrusion may be disposed on the third surface.

The protrusion may be further disposed on the first surface.

The protrusion may be disposed on both surfaces of at least one of the second surface and the fourth surface.

The protrusions disposed on both surfaces of the at least one of the second surface and the fourth surface may not be symmetrical to each other with respect to the at least one of the second surface and the fourth surface.

A pair of protrusions respectively disposed on the second surface and the fourth surface in the region formed by the second surface, the third surface, the fourth surface, and the second substrate may be disposed to be symmetrical to each other with respect to the direction in which the fluid passes, and another pair of protrusions respectively disposed on the second surface and the fourth surface at the outside of the region formed by the second surface, the third surface, the fourth surface, and the second substrate may be disposed to be symmetrical to each other with respect to the direction in which the fluid passes A thermoelectric module according to another embodiment of the present invention includes: a first substrate; a first electrode disposed on the first substrate; a semiconductor structure disposed on the first electrode; a second electrode disposed on the semiconductor structure; a second substrate disposed on the second electrode; and a plurality of heat sinks disposed on the second substrate to be spaced apart from each other by a predetermined distance, wherein the plurality of heat sinks are disposed to be spaced apart from each other by a first distance in a first direction which is a direction in which a fluid passes, and the first distance is 2.5 to 12.5% of a width of the second substrate in the first direction.

The plurality of heat sinks may include a first heat sink and a second heat sink disposed to be spaced apart from each other by the first distance in the first direction, and an area of the first heat sink may be different from an area of the second heat sink.

A separation region between the first heat sink and the second heat sink may be disposed between a point of 50% and a point of 100% of a width of the second substrate based on one end of the second substrate.

The separation region between the first heat sink and the second heat sink may be disposed between a point of 60% and a point of 90% of a width of the second substrate based on one end of the second substrate.

The first direction may be a direction from one end of the second substrate toward the other end opposite the one end of the second substrate.

The plurality of heat sinks may include a first heat sink and a second heat sink spaced apart from each other by the first distance in the first direction, the first heat sink may include a 1-1 heat sink and a 1-2 heat sink disposed to be spaced apart from each other by a second distance in a second direction perpendicular to the first direction, and the second heat sink may include a 2-1 heat sink and a 2-2 heat sink disposed to be spaced apart from each other by the second distance in the second direction.

The first distance may be greater than the second distance.

The first distance may be 1.1 times to 2.8 times the second distance.

The second substrate may include a plurality of sub-substrates spaced apart from each other, and at least one heat sink may be disposed on each sub-substrate.

The plurality of sub-substrates may be connected to each other by an insulating structure.

The thermoelectric module may further include a shield structure disposed to cover a separation region between the plurality of sub-substrates.

Each heat sink may have a shape in which predetermined patterns are connected while being regularly repeated, and each pattern may include a first surface disposed on the second substrate, a second surface extending upward from one end of the first surface, a third surface extending from the second surface to face the second substrate, and a fourth surface extending upward from the other end opposite the one end of the first surface.

A power generation device according to one embodiment of the present invention includes: a first fluid flow unit; a thermoelectric element disposed on the first fluid flow unit; and a second fluid flow unit disposed on the thermoelectric element, wherein the thermoelectric element includes a first substrate disposed on the first fluid flow unit, a first electrode disposed on the first substrate, a semiconductor structure disposed on the first electrode, a second electrode disposed on the semiconductor structure, and a second substrate disposed on the second electrode, the second fluid flow unit includes a heat sink disposed on the second substrate, and the heat sink includes a protrusion disposed on at least one surface on a path through which a fluid passes.

A power generation device according to another embodiment of the present invention includes: a first fluid flow unit; a thermoelectric element disposed on the first fluid flow unit; and a second fluid flow unit disposed on the thermoelectric element, wherein the thermoelectric element includes a first substrate disposed on the first fluid flow unit, a first electrode disposed on the first substrate, a semiconductor structure disposed on the first electrode, a second electrode disposed on the semiconductor structure, and a second substrate disposed on the second electrode, the second fluid flow unit includes a plurality of heat sinks disposed on the second substrate to be spaced apart from each other by a predetermined distance, the plurality of heat sinks are disposed to be spaced apart from each other by a first distance in a first direction which is a direction in which a fluid passes, and the first distance is 2.5 to 12.5% of a width of the second substrate in the first direction.

Advantageous Effects

According to an embodiment of the present invention, a thermoelectric module having excellent performance and high reliability can be acquired. Specifically, according to the embodiment of the present invention, a thermoelectric module having high heat transfer performance between a substrate and a heat sink can be acquired.

A thermoelectric element according to the embodiment of the present invention can be applied to not only an application implemented in a small size, but also an application implemented in a large size such as a vehicle, a ship, a steel mill, an incinerator, or the like.

DESCRIPTION OF DRAWINGS

FIG. 28 is an exploded perspective view of the thermal conversion device in FIG. 27.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when described as at least one (or one or more) of "A, B, and C."

In addition, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirect contact). Further, when the term "on or under" is expressed, a meaning of not only an upward direction but also a downward direction may be included based on one element.

Figure 1:
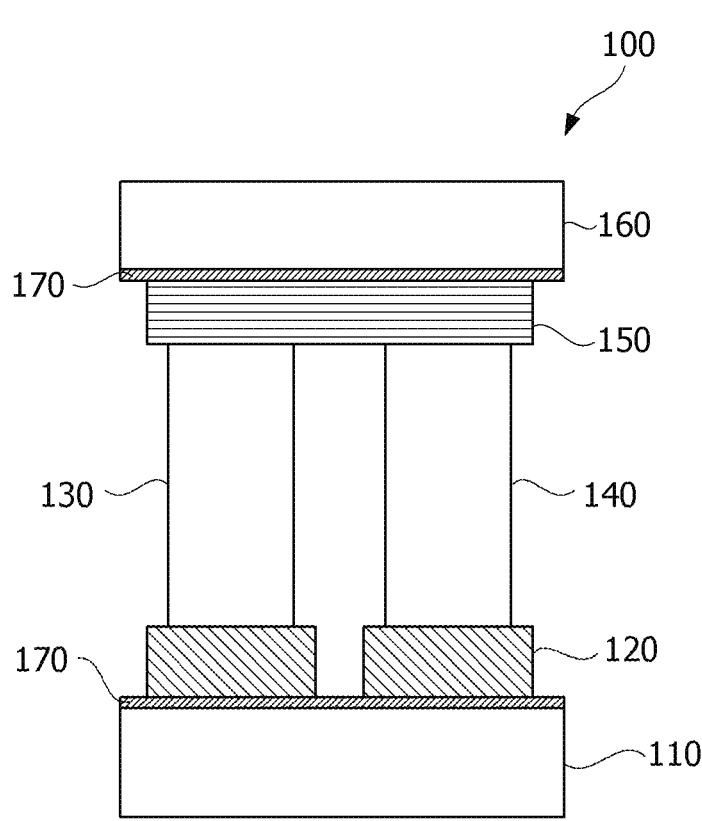
FIG. 1 is a cross-sectional view of a thermoelectric element.
Figure 2:
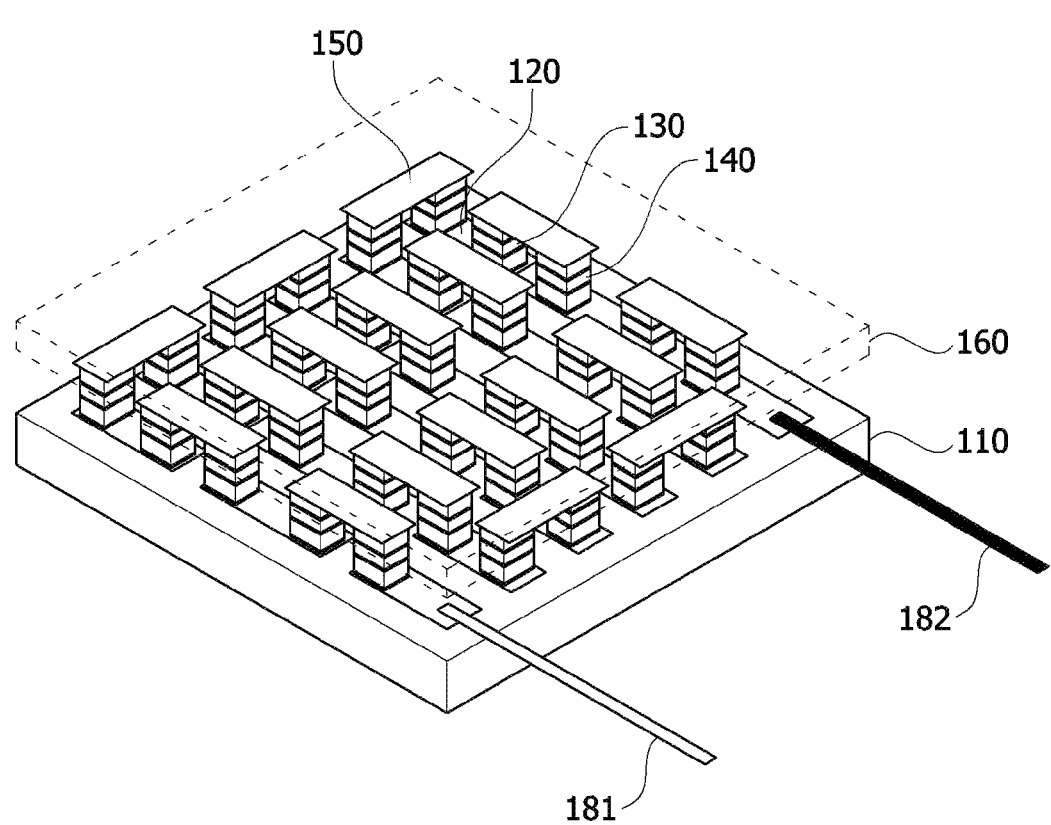
FIG. 2 is a perspective view of the thermoelectric element.

FIG. 1 is a cross-sectional view of a thermoelectric element, and FIG. 2 is a perspective view of the thermoelectric element.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper bottom surfaces of the P-type thermoelectric legs 130 and the N-type thermoelectric legs 140. Accordingly, the plurality of P-type thermoelectric legs 130 and the plurality of N-type thermoelectric legs 140 are electrically connected by the lower electrodes 120 and the upper electrodes 150. One pair of the P-type thermoelectric leg 130 and the N-type thermoelectric leg 140 which are disposed between the lower electrode 120 and the upper electrode 150 and electrically connected to each other may form a unit cell.

For example, when a voltage is applied to the lower electrodes 120 and the upper electrodes 150 through lead lines 181 and 182, a substrate through which current flows from the P-type thermoelectric legs 130 to the N-type thermoelectric legs 140 due to the Peltier effect may absorb heat and act as a cooling unit, and a substrate through which current flows from the N-type thermoelectric legs 140 to the P-type thermoelectric legs 130 may be heated and act as a heating unit. Alternatively, when a temperature difference between the lower electrode 120 and the upper electrode 150 is applied, electric charges in the P-type thermoelectric leg 130 and the N-type thermoelectric leg 140 may move due to the Seebeck effect, and electricity may be generated.

Although FIGS. 1 and 2 illustrate that the lead lines 181 and 182 are disposed on the lower substrate 110, the present invention is not limited thereto, and the lead lines 181 and 182 may be disposed on the upper substrate 160, or one of the lead lines 181 and 182 may be disposed on the lower substrate 110 and the other may be disposed on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a bismuth-telluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te, which is a main raw material, in an amount of 99 to 99.999 wt % and may include at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight. The N-type thermoelectric leg 140 may be a bismuth-telluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te, which is a main raw material, in an amount of 99 to 99.999 wt % and may include at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight. Accordingly, in the present specification, the thermoelectric leg may also be referred to as a semiconductor structure, a semiconductor element, a semiconductor substance layer, a semiconductor material layer, a conductive semiconductor structure, a thermoelectric structure, a thermoelectric substance layer, a thermoelectric material layer, a thermoelectric semiconductor structure, a thermoelectric semiconductor element, a thermoelectric semiconductor substance layer, a thermoelectric semiconductor material layer, or the like.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be acquired through a process of manufacturing an ingot by heat-treating a thermoelectric material, acquiring powder for thermoelectric legs by pulverizing and sieving the ingot, sintering the powder, and then cutting a sintered object. In this case, the P-type thermoelectric leg 130 and the N-type thermoelectric leg 140 may be polycrystalline thermoelectric legs. For the polycrystalline thermoelectric legs, the powder for thermoelectric legs may be compressed at 100 MPa to 200 MPa when being sintered. For example, when the P-type thermoelectric leg 130 is sintered, the powder for thermoelectric legs may be sintered at 100 MPa to 150 MPa, preferably, 110 MPa to 140 MPa, and more preferably, 120 MPa to 130 MPa. Further, when the N-type thermoelectric leg 140 is sintered, the powder for thermoelectric legs may be sintered at 150 MPa to 200 MPa, preferably, 160 MPa to 195 MPa, and more preferably, 170 MPa to 190 MPa. Like the above, when the P-type thermoelectric leg 130 and the N-type thermoelectric leg 140 are polycrystalline thermoelectric legs, the strength of the P-type thermoelectric leg 130 and the N-type thermoelectric leg 140 may be improved. The stacked type P-type thermoelectric leg 130 or the stacked type N-type thermoelectric leg 140 may be acquired through a process of forming a unit member by applying a paste including a thermoelectric material on a sheet-shaped base material, and then stacking and cutting the unit member In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal columnar shape, an elliptical columnar shape, or the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures in which a semiconductor material is applied on a sheet-shaped base material and then cutting the structures. Accordingly, material loss may be prevented and electrical conduction characteristics may be improved. Each structure may further include a conductive layer having an opening pattern, and accordingly, an adhesive force between the structures may be improved, thermal conductivity may be lowered, and electrical conductivity may be improved.

Alternatively, the P-type thermoelectric leg 130 or the N-type thermoelectric leg 140 may be formed to have different cross-sectional areas in one thermoelectric leg. For example, cross-sectional areas of both end portions disposed to face an electrode in one thermoelectric leg may be formed to be larger than a cross-sectional area between the both end portions. Accordingly, since a large temperature difference between both end portions may be formed, thermoelectric efficiency may be improved.

The performance of the thermoelectric element according to one embodiment of the present invention may be expressed as a thermoelectric figure of merit (ZT). The thermoelectric figure of merit (ZT) may be expressed as in Equation 1.

$$ZT = \alpha^2 \cdot \sigma \cdot T/k \qquad \text{[Equation 1]}$$

Here, α denotes the Seebeck coefficient [V/K], σ denotes electrical conductivity [S/m], and α2σ denotes a power factor (W/mK2]). Further, T denotes temperature, and k denotes thermal conductivity [W/mK]. k may be expressed as a·cp·ρ, wherein a denotes thermal diffusivity [cm2/S], cp denotes specific heat [J/gK], and ρ denotes density [g/cm3].

In order to acquire the thermoelectric figure of merit of the thermoelectric element, a Z value (V/K) is measured using a Z meter, and the thermoelectric figure of merit (ZT) may be calculated using the measured Z value.

Here, each of the lower electrodes 120 disposed between the lower substrate 110 and the P-type thermoelectric legs 130 and the N-type thermoelectric legs 140 and the upper electrodes 150 disposed between the upper substrate 160 and the P-type thermoelectric legs 130 and the N-type thermoelectric legs 140 may include at least one of copper (Cu), silver (Ag), aluminum (Al), and nickel (Ni), and may have a thickness of 0.01 mm to 0.3 mm. When the thickness of the lower electrode 120 or the upper electrode 150 is smaller than 0.01 mm, the function as an electrode may be deteriorated and electrical conduction performance may be lowered, and when the thickness of the lower electrode 120 or the upper electrode 150 exceeds 0.3 mm, conduction efficiency may be lowered due to an increase in resistance.

Further, the lower substrate 110 and the upper substrate 160 facing each other may be metal substrates, and each thickness thereof may be 0.1 mm to 1.5 mm. When the thickness of the metal substrate is smaller than 0.1 mm or exceeds 1.5 mm, since heat dissipation characteristics or thermal conductivity may be excessively high, the reliability of the thermoelectric element may be deteriorated. Further, when the lower substrate 110 and the upper substrate 160 are metal substrates, insulating layers 170 may be further formed between the lower substrate 110 and the lower electrode 120 and between the upper substrate 160 and the upper electrode 150. The insulating layer 170 may include a material having a thermal conductivity of 1 to 20 W/mK.

In this case, the lower substrate 110 and the upper substrate 160 may be formed to have different sizes. For example, a volume, thickness, or area of one of the lower substrate 110 and the upper substrate 160 may be formed to be larger than a volume, thickness, or area of the other. Accordingly, it is possible to improve the heat absorption performance or heat dissipation performance of the thermoelectric element. For example, at least one of a volume, thickness, or area of a substrate disposed in a high temperature region for the Seebeck effect, applied as a heating region for the Peltier effect, or on which a sealing member for protecting the thermoelectric module from an external environment is disposed may be larger than at least one of a volume, thickness, or area of the other substrate.

Further, a heat dissipation pattern, for example, a concavo-convex pattern may be formed on the surface of at least one of the lower substrate 110 and the upper substrate 160. Accordingly, the heat dissipation performance of the thermoelectric element may be improved. When the concavo-convex pattern is formed on the surface which comes into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

Although not shown in the drawings, a sealing member may be further disposed between the lower substrate 110 and the upper substrate 160. The sealing member may be disposed on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like. Here, the sealing member may include a sealing case disposed a predetermined distance from outermost side surfaces of the plurality of lower electrodes 120, the plurality of P-type thermoelectric legs 130 and the plurality of N-type thermoelectric legs 140, and the plurality of upper electrodes 150, a sealing material disposed between the sealing case and the lower substrate 110, and a sealing material disposed between the sealing case and the upper substrate 160. Like the above, the sealing case may come into contact with the lower substrate 110 and the upper substrate 160 through the sealing material. Accordingly, when the sealing case comes into direct contact with the lower substrate 110 and the upper substrate 160, heat conduction occurs through the sealing case, and as a result, a problem in that a temperature difference between the lower substrate 110 and the upper substrate 160 is lowered may be prevented. Here, the sealing material may include at least one of an epoxy resin and a silicone resin, or a tape in which at least one of the epoxy resin and the silicone resin is applied on both surfaces. The sealing material may serve to seal between the sealing case and the lower substrate 110 and between the sealing case and the upper substrate 160, may improve a sealing effect of the lower electrodes 120, the P-type thermoelectric legs 130, the N-type thermoelectric legs 140, and the upper electrodes 150, and may be used interchangeably with a finishing material, a finishing layer, a waterproofing material, a waterproofing layer, and the like.

However, the above description of the sealing member is only an example, and the sealing member may be modified in various ways. Although not shown in the drawings, an insulating material may be further included to surround the sealing member. Alternatively, the sealing member may include an insulating component.

In the above, although the terms "lower substrate 110, lower electrode 120, upper electrode 150, and upper substrate 160" are used, they are only arbitrarily referred to as upper and lower portions for ease of understanding and convenience of description, and positions may be reversed so that the lower substrate 110 and the lower electrode 120 may be disposed at an upper portion, and the upper electrode 150 and the upper substrate 160 may be disposed at a lower portion. Hereinafter, for convenience of description, the lower substrate 110, the lower electrode 120, the upper electrode 150, and the upper substrate 160 may be respectively referred to as a first substrate 110, a first electrode 120, a second electrode 150, and a second substrate 160.

Figure 3:
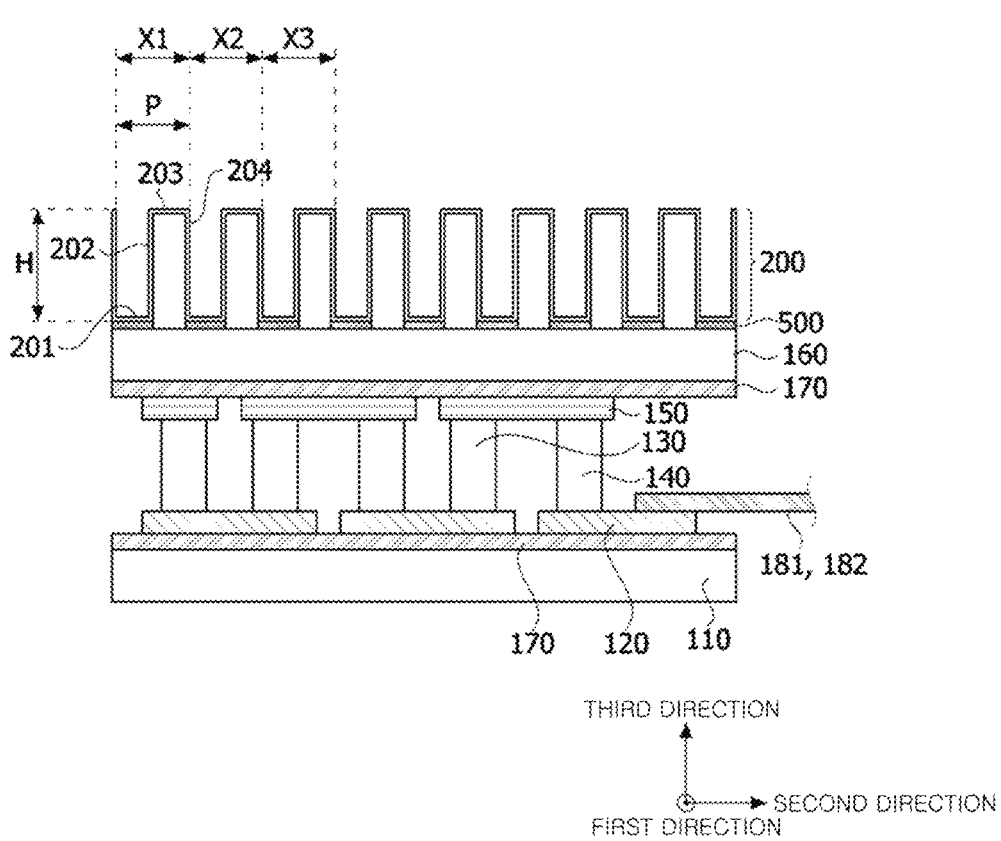
FIG. 3 is an example of a cross-sectional view of a thermoelectric module in which a heat sink is disposed on the thermoelectric element.
Figure 4:
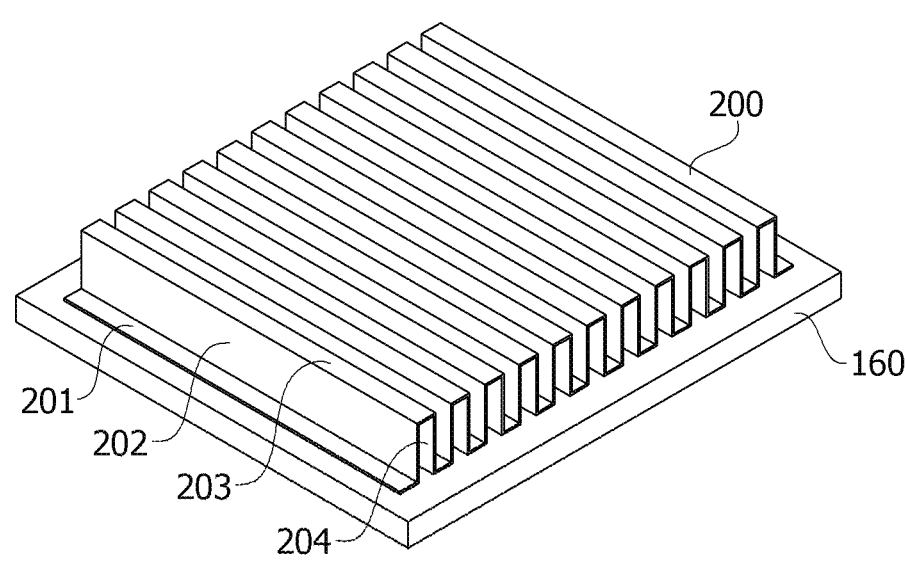
FIG. 4 is a perspective view of a substrate and the heat sink in the thermoelectric module exemplified in FIG. 3.
Figure 5:
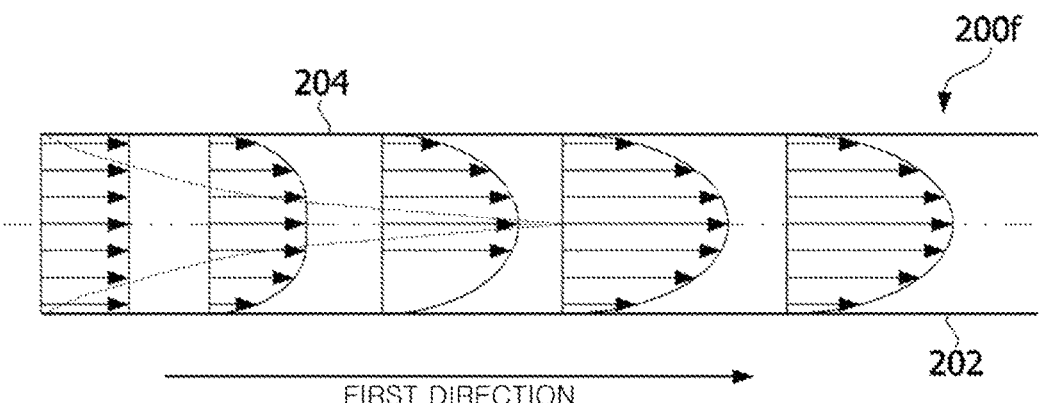
FIG. 5 illustrates a flow of a fluid in one fin of the heat sink in FIG. 4.

FIG. 3 is an example of a cross-sectional view of the thermoelectric module in which a heat sink is disposed on the thermoelectric element, FIG. 4 is a perspective view of the substrate and the heat sink in the thermoelectric module exemplified in FIG. 3, and FIG. 5 illustrates a flow of a fluid in one fin of the heat sink in FIG. 4.

Referring to FIGS. 3 and 4, a heat sink 200 is disposed on the second substrate 160 of the thermoelectric element 100. As described above, the thermoelectric element 100 may include the first substrate 110, the first electrode 120, the P-type thermoelectric leg 130, the N-type thermoelectric leg 140, the second electrode 150, the second substrate 160, and the insulating layer 170, and the lead lines 181 and 182 may be connected to the first electrode 120.

In this case, the heat sink 200 may be implemented to form an air flow path using a flat plate-shaped base material so as to come into surface contact with a fluid, for example, air passing through the heat sink 200 in a first direction. That is, the heat sink 200 may have a structure in which the base material is folded to form repeated patterns having a predetermined pitch P and a height H, that is, a folded structure. A unit of the repeated patterns, that is, each pattern, may be referred to as a fin 200f.

According to the embodiment of the present invention, the heat sink 200 may have a shape in which predetermined patterns are regularly repeated and connected. That is, the heat sink 200 includes a first pattern X1, a second pattern X2, and a third pattern X3, and these patterns may be integrated flat plates which are sequentially connected.

According to the embodiment of the present invention, each of the patterns X1, X2, and X3 may include a first surface 201, a second surface 202, a third surface 203, and a fourth surface 204 which are sequentially connected.

The first surface 201 may be disposed on the second substrate 160 to come into contact with an adhesive layer 500. The adhesive layer 500 may be a heat transfer material layer or a thermal grease layer. In some embodiments, the adhesive layer 500 may be omitted, and the second substrate 160 and the heat sink 200 may be coupled by a coupling member. The second surface 202 may be connected to the first surface 201 and disposed in a direction perpendicular to the second substrate 160. That is, the second surface 202 may extend upward from one end of the first surface 201. The third surface 203 may be connected to the second surface 202 and disposed to face the second substrate 160. In this case, a distance between the second substrate 160 and the third surface 203 may be greater than a distance between the second substrate 160 and the first surface 201. The fourth surface 204 may be connected to the third surface 203, perpendicular to the second substrate 160, and disposed to face the second surface 202.

The first surface 201, the second surface 202, the third surface 203, and the fourth surface 204 may be integrated flat plates having a sequentially folded structure, a set of the first surface 201, the second surface 202, the third surface 203, and the fourth surface 204 may form one fin 200f, and each fin 200f may extend in a direction in which the fluid passes, that is, the first direction.

Meanwhile, referring to FIG. 5, it can be seen that a flow velocity of a fluid flowing in a middle region within one fin 200f may be faster than a flow velocity of a fluid flowing in an edge region. According to the principle of an entrance length of a laminar flow, a flow velocity difference of the fluid between the edge region and the middle region may increase as the distance from a fluid inlet increases, that is, as a length of one fin according to the first direction in which the fluid flows increases. Accordingly, some of the fluid flowing in the middle region of the fin 200f may be discharged without heat exchange with the heat sink.

According to the embodiment of the present invention, heat exchange efficiency between the fluid and the heat sink will be improved by disposing a structure forming an eddy in the fluid on the heat sink.

Figure 6:
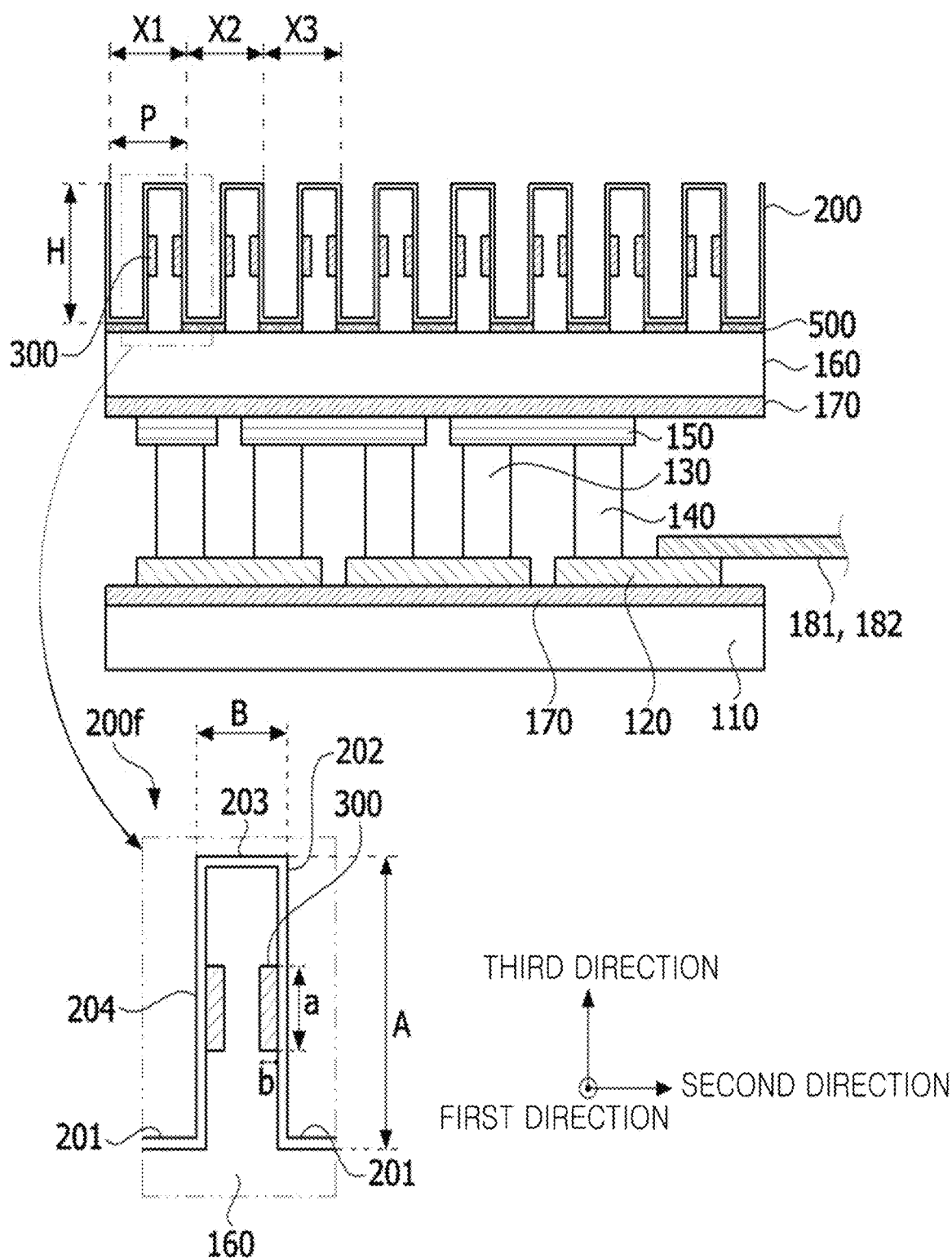
FIG. 6 is a cross-sectional view of a thermoelectric module according to one embodiment of the present invention.
Figure 7:
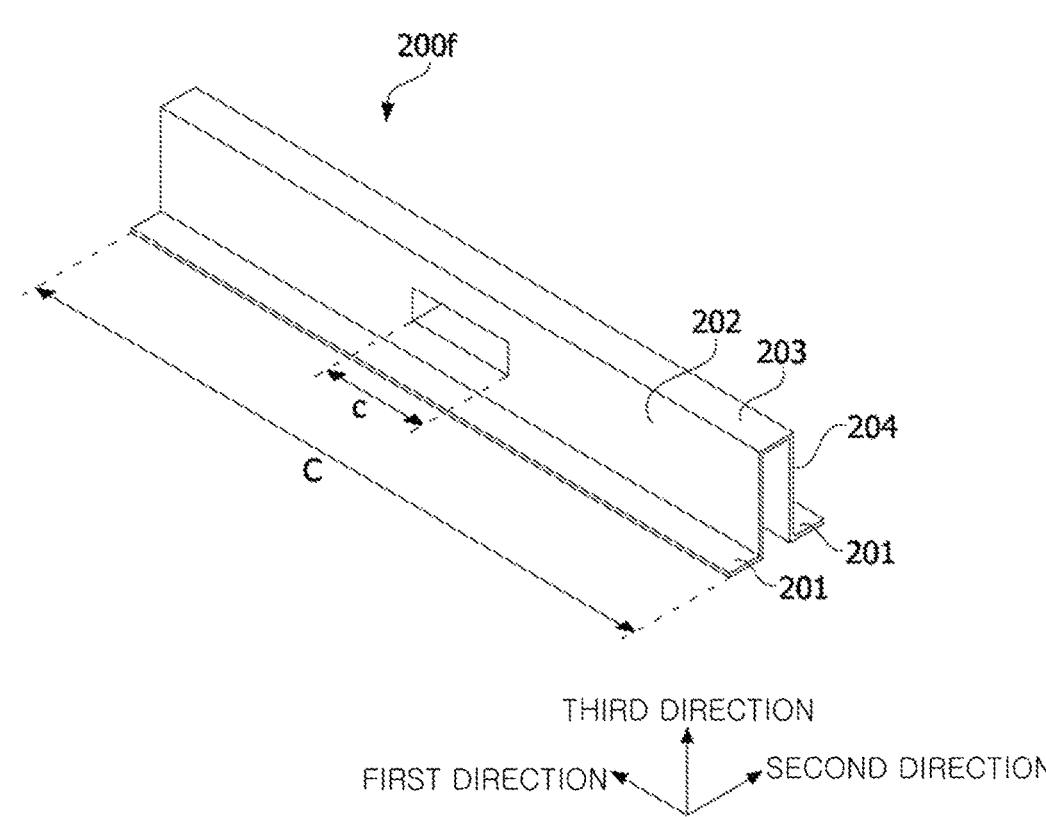
FIG. 7 is a perspective view of one fin in a heat sink included in the thermoelectric module according to one embodiment of the present invention.
Figure 8:
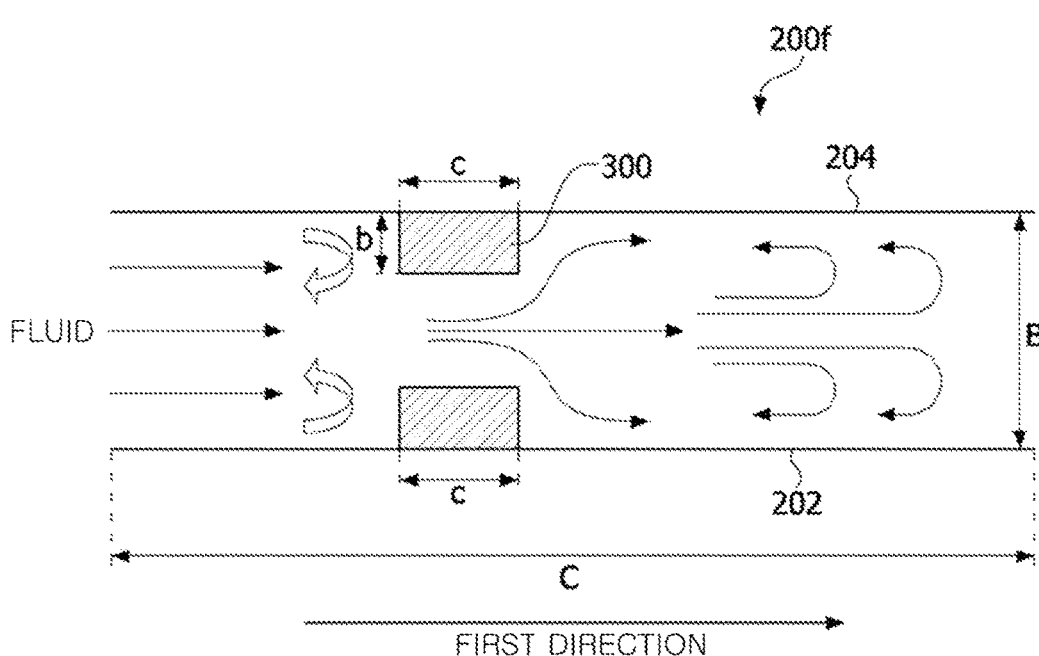
FIGS. 8 and 9 are cross-sectional views of one fin in the heat sink included in the thermoelectric module according to one embodiment of the present invention.
Figure 9:
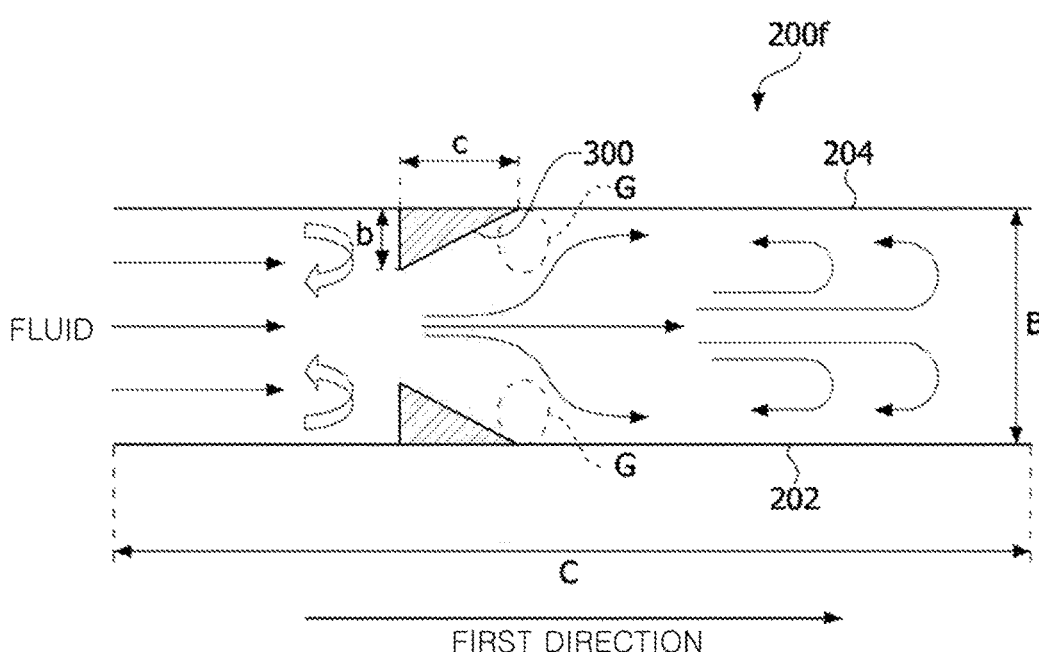

FIG. 6 is a cross-sectional view of the thermoelectric module according to one embodiment of the present invention, FIG. 7 is a perspective view of one fin in the heat sink included in the thermoelectric module according to one embodiment of the present invention, and FIGS. 8 and 9 are cross-sectional views of one fin in the heat sink included in the thermoelectric module according to one embodiment of the present invention. Here, since the content relating to a detailed structure of the thermoelectric element 100, that is, the lower substrate 110, the lower electrode 120, the P-type thermoelectric leg 130, the N-type thermoelectric leg 140, the upper electrode 150, the upper substrate 160, and the insulating layer 170 may be applied in the same manner as the content described in FIGS. 1 and 2, overlapping description will be omitted for convenience of description.

Referring to FIGS. 6 to 9, the adhesive layer 500 is disposed on the second substrate 160, and the heat sink 200 is disposed on the adhesive layer 500. The second substrate 160 and the heat sink 200 may be bonded by the adhesive layer 500. The adhesive layer 500 may be a heat transfer material layer or a thermal grease layer. However, in some embodiments, the adhesive layer 500 may be omitted, and the second substrate 160 and the heat sink 200 may be coupled by a coupling member. Here, an example in which the heat sink 200 is disposed on the upper substrate 160, that is, the second substrate 160, is described, but this is for convenience of description, and the present invention is not limited thereto. That is, a heat sink 200 having the same structure as the embodiment of the present invention may be disposed on the lower substrate 110, that is, the first substrate

110, and may also be disposed on both the first substrate 110 and the second substrate 160.

The heat sink 200 according to the embodiment of the present invention has a shape in which predetermined patterns are connected while being regularly repeated, and each pattern extends in the direction in which the fluid passes, that is, the first direction. The content related to each pattern may be applied in the same manner as the content described with reference to FIGS. 3 and 4.

According to the embodiment of the present invention, the heat sink 200 includes a protrusion 300 disposed on at least one surface on a path through which the fluid passes. Accordingly, when the fluid passing through the heat sink 200 meets the protrusion 300, since a flow of fluid changes from a laminar flow to a turbulent flow, the flow velocity may slow down, and the heat exchange amount between the heat sink 200 and the fluid may increase.

More specifically, the protrusion 300 may be disposed on each of the patterns X1, X2, and X3. Accordingly, the flow velocity of the fluid passing through each of the patterns X1, X2, and X3 may be uniformly controlled with respect to the entire heat sink 200.

As described above, the first surface 201 may be disposed on the second substrate 160 to come into contact with the adhesive layer 500. The second surface 202 may be connected to the first surface 201 and disposed in the direction perpendicular to the second substrate 160. That is, the second surface 202 may extend upward from one end of the first surface 201. The third surface 203 may be connected to the second surface 202 and disposed to face the second substrate 160. In this case, the distance between the second substrate 160 and the third surface 203 may be greater than the distance between the second substrate 160 and the first surface 201. The fourth surface 204 may be connected to the third surface 203, perpendicular to the second substrate 160, and disposed to face the second surface 202.

The protrusion 300 according to the embodiment of the present invention may be disposed on at least one of the first surface 201, the second surface 202, the third surface 203, and the fourth surface 204. For example, as shown in FIGS. 6 to 9, the protrusion 300 may be disposed in a region formed by the second surface 202, the third surface 203, the fourth surface 204, and the second substrate 160, and specifically, may be disposed on the second surface 202 and the fourth surface 204. Referring to FIGS. 8 and 9, a fluid introduced into the region formed by the second surface 202, the third surface 203, the fourth surface 204, and the second substrate 160, that is, the fin 200f, flows along the first direction in the fin 200f. When the fluid meets the protrusion 300, a turbulent flow occurs and thus the flow velocity of the fluid slows down, and accordingly, the heat exchange amount between the fin 200f and the fluid may increase. In this case, in order to efficiently generate the turbulent flow, both protrusions 300 disposed on the second surface 202 and the fourth surface 204 may be disposed to be symmetrical to each other.

In this case, a height a of the protrusion 300 according to the direction perpendicular to the second substrate 160 is 30 to 50% of a distance A between the second substrate 160 and the third surface 203, a thickness b of the protrusion 300 according to a direction perpendicular to the direction in which the fluid passes and parallel to the second substrate 160 is 10 to 20% of a distance B between the second surface 202 and the fourth surface 204, and a length c of the protrusion 300 according to the direction in which the fluid passes may be 4 to 10% of a length of each of the second surface 202 and the fourth surface 204. When the protrusion 300 is greater than or equal to a lower limit of the above numerical ranges, the turbulent flow may be formed in the heat sink 200, and when the protrusion 300 is smaller than or equal to an upper limit of the above numerical ranges, a pressure difference between the fluid introduced into the heat sink 200 and the fluid discharged from the heat sink 200 may be minimized.

In this case, the protrusion 300 may be disposed to be spaced apart from the second substrate 160. Accordingly, since the fluid flowing at a middle height among the fluid passing between the second substrate 160 and the third surface 203 forms an eddy, an eddy may also be formed in each of the fluid flowing at a low height along the second substrate 160 and the fluid flowing at a high height along the third surface 203.

Here, the protrusion 300 may be formed of a metal material. For example, the protrusion 300 may be formed of the same type of metal as the heat sink 200. For example, as shown in FIG. 7, the protrusion 300 may be integrally formed with the heat sink 200. That is, in the case in which the protrusion 300 is disposed on the second surface 202, when a groove recessed in one surface of both surfaces of the second surface 202 is molded, the protrusion 300 may be formed on the opposite surface. Accordingly, since the fluid which comes into contact with the protrusion 300 may also be heat-exchanged, the heat exchange amount of the fluid may increase.

Meanwhile, as shown in FIG. 8, the protrusion 300 may have a quadrangular cross section, that is, a hexahedral shape. Alternatively, as shown in FIG. 9, the protrusion 300 may have a triangular cross section, that is, a triangular prism shape. Like the above, in the case in which the protrusion 300 has a triangular shape, when the thickness b of the protrusion 300 decreases along the first direction, which is a direction in which the fluid passes, since the fluid may also be introduced into a G region, a heat exchange area and the heat exchange amount between the heat sink 200 and the fluid increase.

Figure 10:
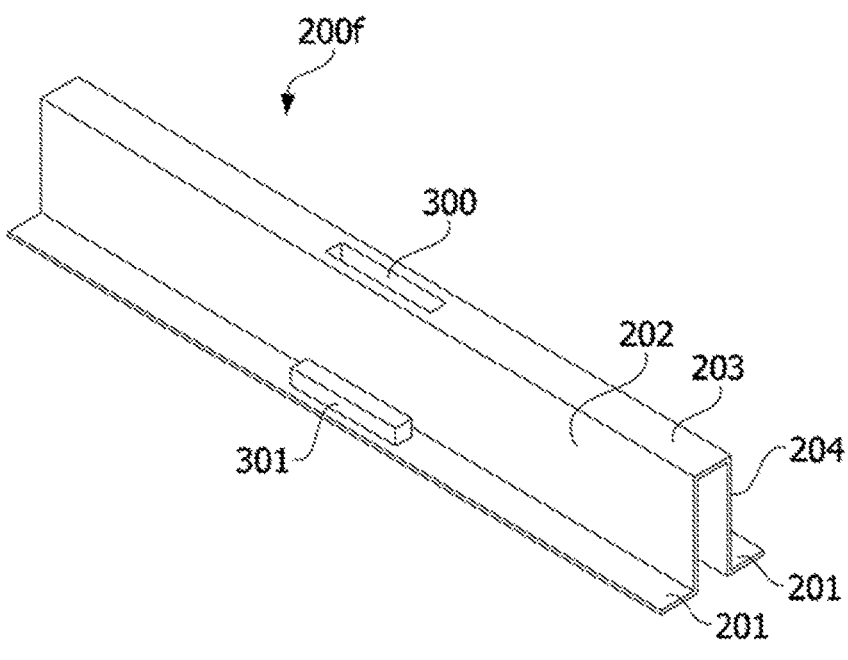
FIGS. 10 and 11 illustrate a structure of a protrusion according to another embodiment of the present invention.
Figure 10:
Figure 11:
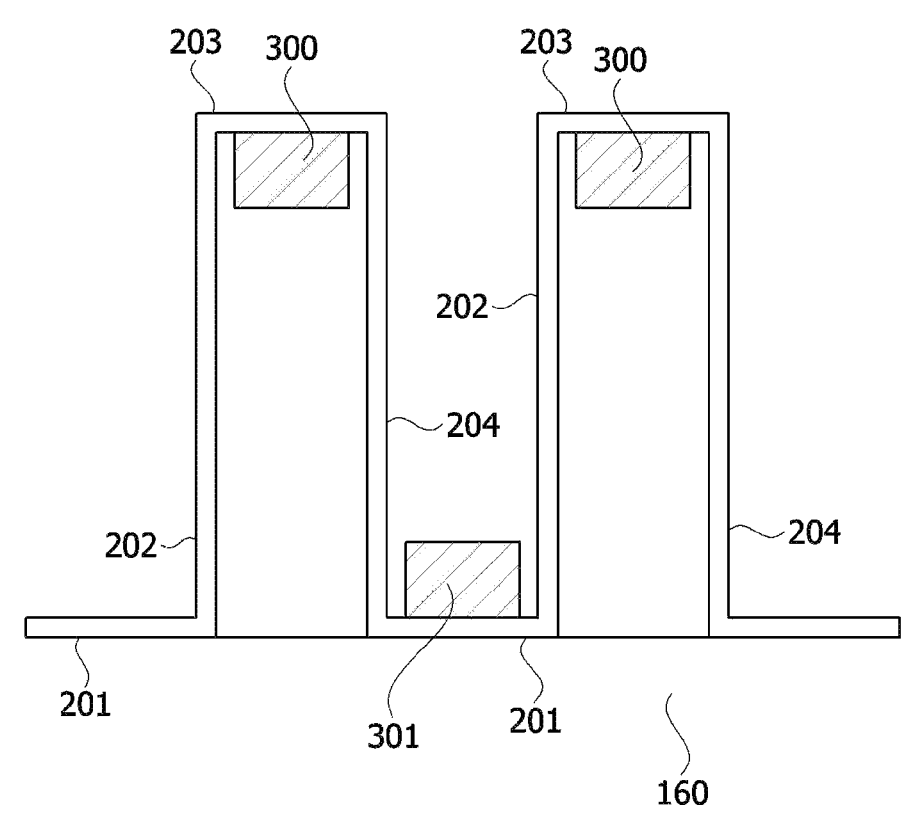
Figure 12:
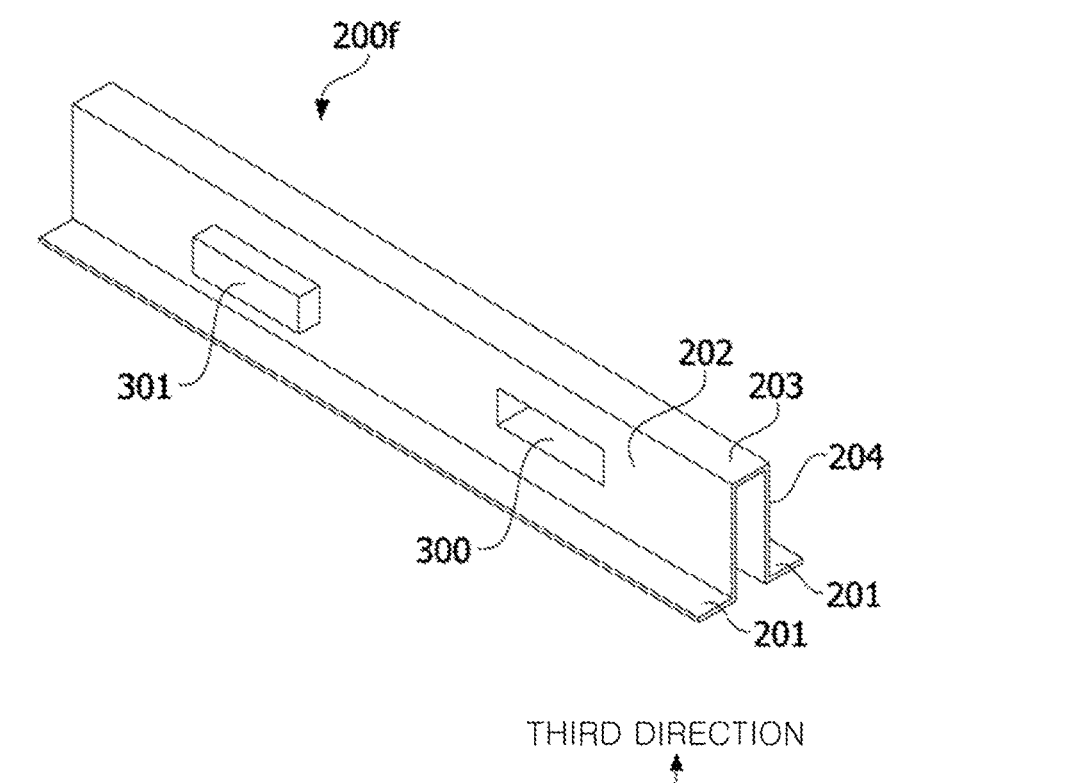
FIGS. 12 and 13 illustrate a structure of a protrusion according to still another embodiment of the present invention.
Figure 13:
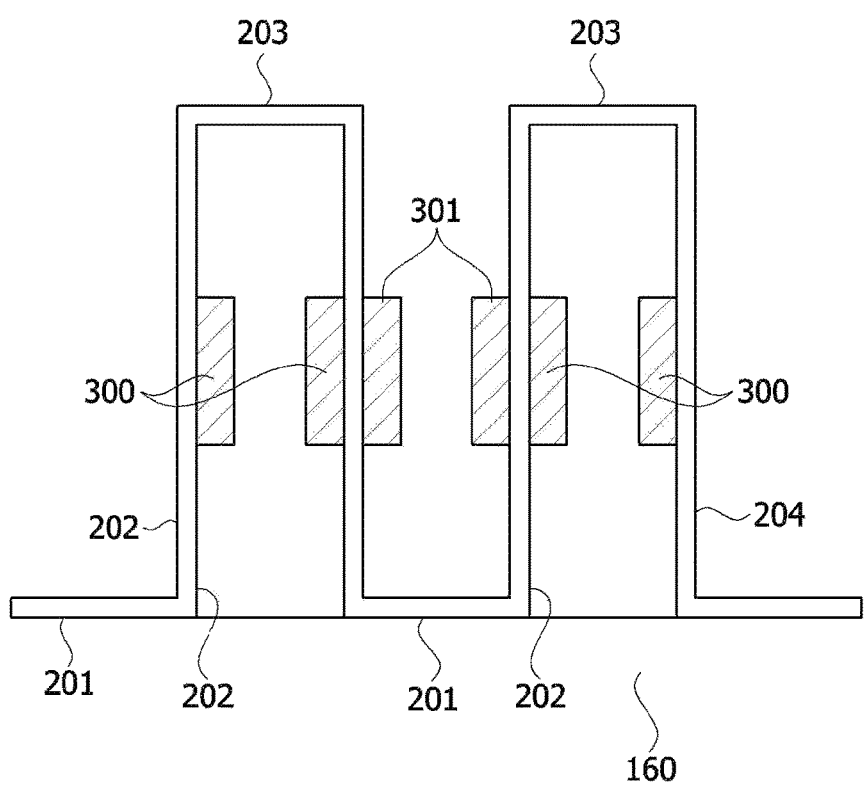

FIGS. 10 and 11 illustrate a structure of a protrusion according to another embodiment of the present invention, and FIGS. 12 and 13 illustrate a structure of a protrusion according to still another embodiment of the present invention.

Referring to FIGS. 10 and 11, a protrusion 300 may be disposed in the region formed by the second surface 202, the third surface 203, the fourth surface 204, and the second substrate 160, and disposed on the third surface 203. Although not shown in the drawings, the protrusion 300 disposed on the second surface 202 and the fourth surface 204 and the protrusion 300 disposed on the third surface 203 may be formed together in one fin 200f. Alternatively, a protrusion 301 may be further disposed on the first surface 201. Accordingly, since an eddy of the fluid may be generated not only in the region formed by the second surface 202, the third surface 203, the fourth surface 204, and the second substrate 160, but also outside the region formed by the second surface 202, the third surface 203, the fourth surface 204, and the second substrate 160, heat exchange efficiency may be improved.

Referring to FIGS. 12 and 13, protrusions 300 may be disposed on the second surface 202 and the fourth surface 204 in the region formed by the second surface 202, the third surface 203, the fourth surface 204, and the second substrate 160, and protrusions 301 may be disposed on the second surface 202 and the fourth surface 204 outside the region formed by the second surface 202, the third surface 203, the fourth surface 204, and the second substrate 160. That is, the protrusions 300 and 301 may be disposed on both surfaces of the second surface 202 and/or both surfaces of the fourth surface 204. Accordingly, since an eddy of the fluid may be generated not only in the region formed by the second surface 202, the third surface 203, the fourth surface 204, and the second substrate 160, but also outside the region formed by the second surface 202, the third surface 203, the fourth surface 204, and the second substrate 160, heat exchange efficiency may be improved. In this case, two protrusions 300 disposed on the second surface 202 and the fourth surface 204 in the region formed by the second surface 202, the third surface 203, the fourth surface 204, and the second substrate 160 may be disposed to be symmetrical to each other with respect to the direction in which the fluid passes. Further, two protrusions 301 disposed on the second surface 202 and the fourth surface 204 outside the region formed by the second surface 202, the third surface 203, the fourth surface 204, and the second substrate 160 may be disposed to be symmetrical to each other with respect to the direction in which the fluid passes. In addition, the protrusion 300 and the protrusion 301 may be disposed so as not to be symmetrical with respect to the second surface 202 and the fourth surface 204. Accordingly, since a position where the eddy is formed in the region formed by the second surface 202, the third surface 203, the fourth surface 204, and the second substrate 160 and a position where the eddy is formed outside the region formed by the second surface 202, the third surface 203, the fourth surface 204, and the second substrate 160 may become different, heat exchange positions may be uniformly dispersed along the direction in which the fluid flows, and heat exchange efficiency may be improved.

Figure 14:
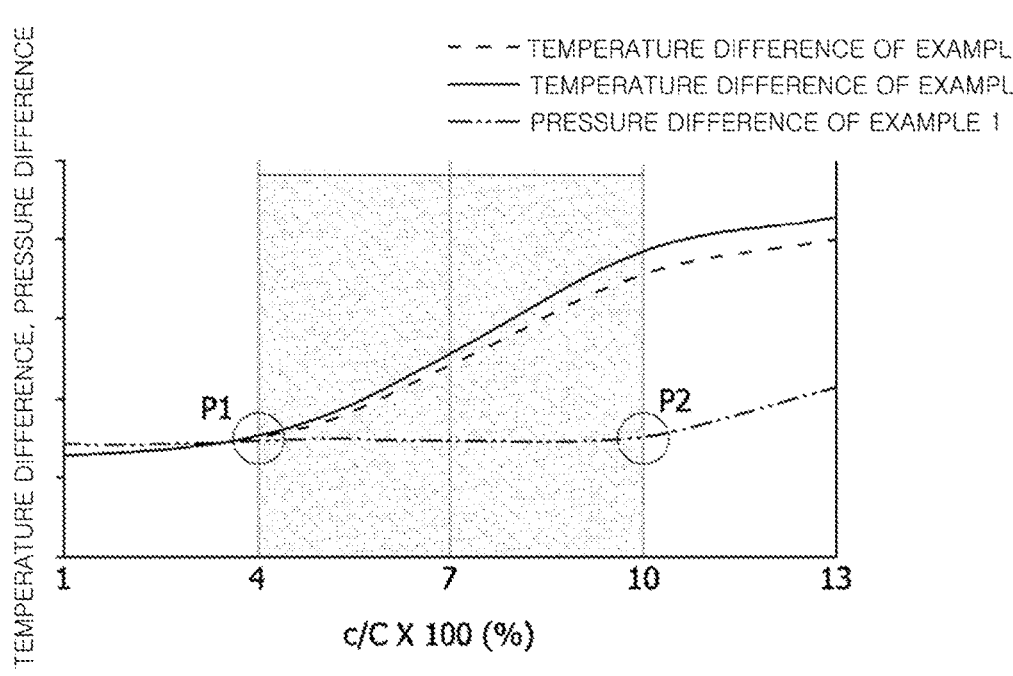
FIGS. 14 to 16 illustrate experimental results of a temperature difference and a pressure difference of a fluid with respect to a size of the protrusion according to the embodiment of the present invention.
Figure 15:
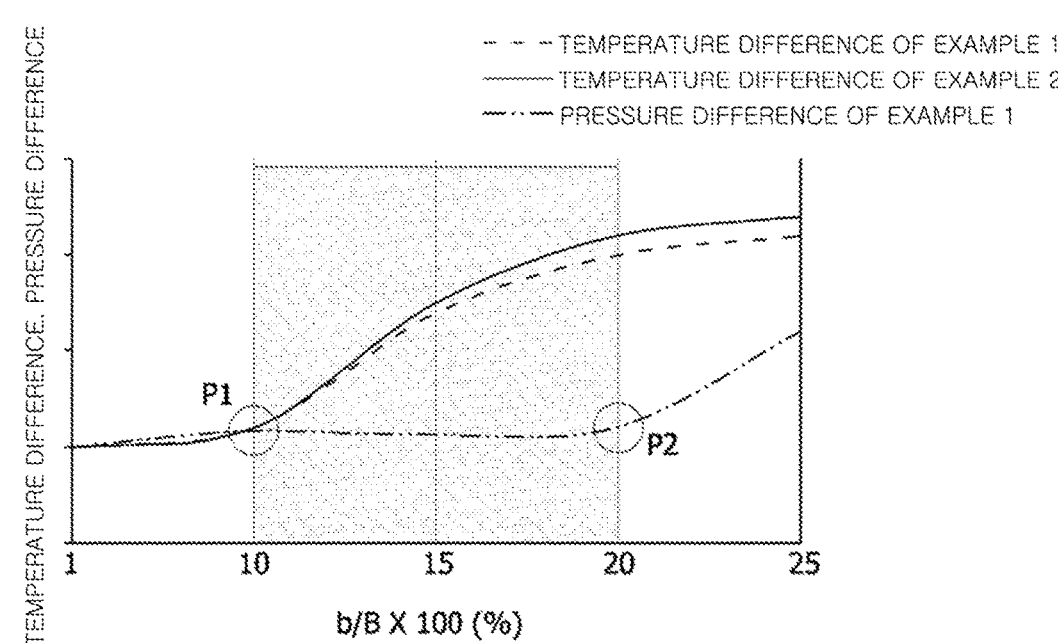
Figure 16:
Figure 16:
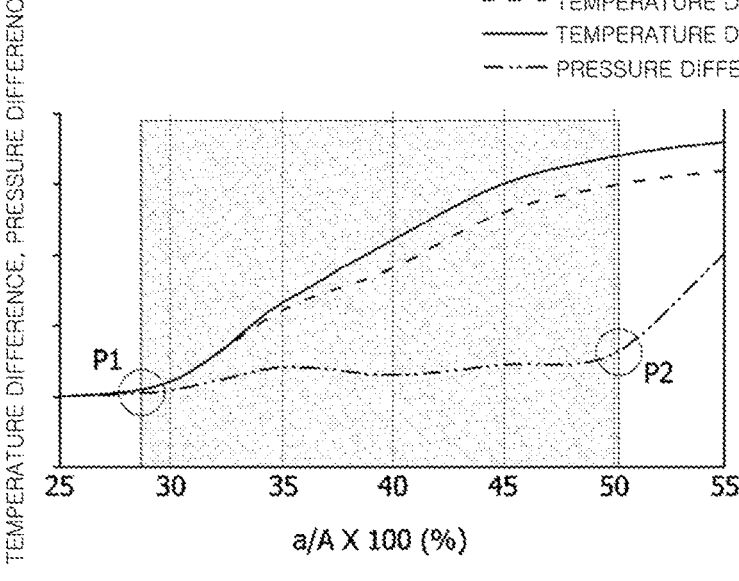

FIGS. 14 to 16 illustrate experimental results of a temperature difference and a pressure difference of the fluid with respect to a size of the protrusion according to the embodiment of the present invention.

Here, as shown in FIGS. 6 to 9, Examples 1 and 2 are cases in which the protrusions 300 are disposed on the second surface 202 and the fourth surface 204 in the region formed by the second surface 202, the third surface 203, the fourth surface 204, and the second substrate 160, wherein Example 1 is a case in which the protrusion 300 has a hexahedral shape as shown in FIG. 8, and Example 2 is a case in which the protrusion 300 has a triangular prism shape as shown in FIG. 9. The temperature difference refers to a temperature difference between the fluid introduced into the heat sink 200 and the fluid discharged from the heat sink 200, and the pressure difference refers to a pressure difference between the fluid introduced into the heat sink 200 and the fluid discharged from the heat sink 200. A larger temperature difference refers to higher heat exchange performance, and a larger pressure difference refers to lower heat exchange performance.

In FIG. 14, as a result of testing the temperature difference and the pressure difference while increasing the length c of the protrusion 300 with respect to a length C of each of the second surface 202 and the fourth surface 204 according to the direction in which the fluid passes, it can be seen that the temperature difference increases when the length c of the protrusion 300 according to the direction in which the fluid passes is greater than or equal to 4% (P1) of the length C of each of the second surface 202 and the fourth surface 204, and the pressure difference increases when the length c of the protrusion 300 according to the direction in which the fluid passes exceeds 10% (P2) of the length C of each of the second surface 202 and the fourth surface 204.

In FIG. 15, as a result of testing the temperature difference and the pressure difference while increasing the thickness b of the protrusion 300 with respect to the distance B between the second surface 202 and the fourth surface 204 according to the direction parallel to the second substrate 160, it can be seen that the temperature difference increases when the thickness b of the protrusion 300 according to the direction parallel to the second substrate 160 is greater than or equal to 10% of the distance B between the second surface 202 and the fourth surface 204 (P1), and the pressure difference increases when the thickness b of the protrusion 300 according to the direction parallel to the second substrate 160 exceeds 20% of the distance B between the second surface 202 and the fourth surface 204.

In FIG. 16, as a result of testing the temperature difference and the pressure difference while increasing the height a of the protrusion 300 with respect to the distance A between the second substrate 160 and the third surface 203 according to the direction perpendicular to the second substrate 160, it can be seen that the temperature difference increases when the height a of the protrusion 300 according to the direction perpendicular to the second substrate 160 is greater than or equal to 30% (P1) of the distance A between the second substrate 160 and the third surface 203, and the pressure difference increases when the height a of the protrusion 300 according to the direction perpendicular to the second substrate 160 exceeds 50% of the distance A between the second substrate 160 and the third surface 203.

Figure 17:
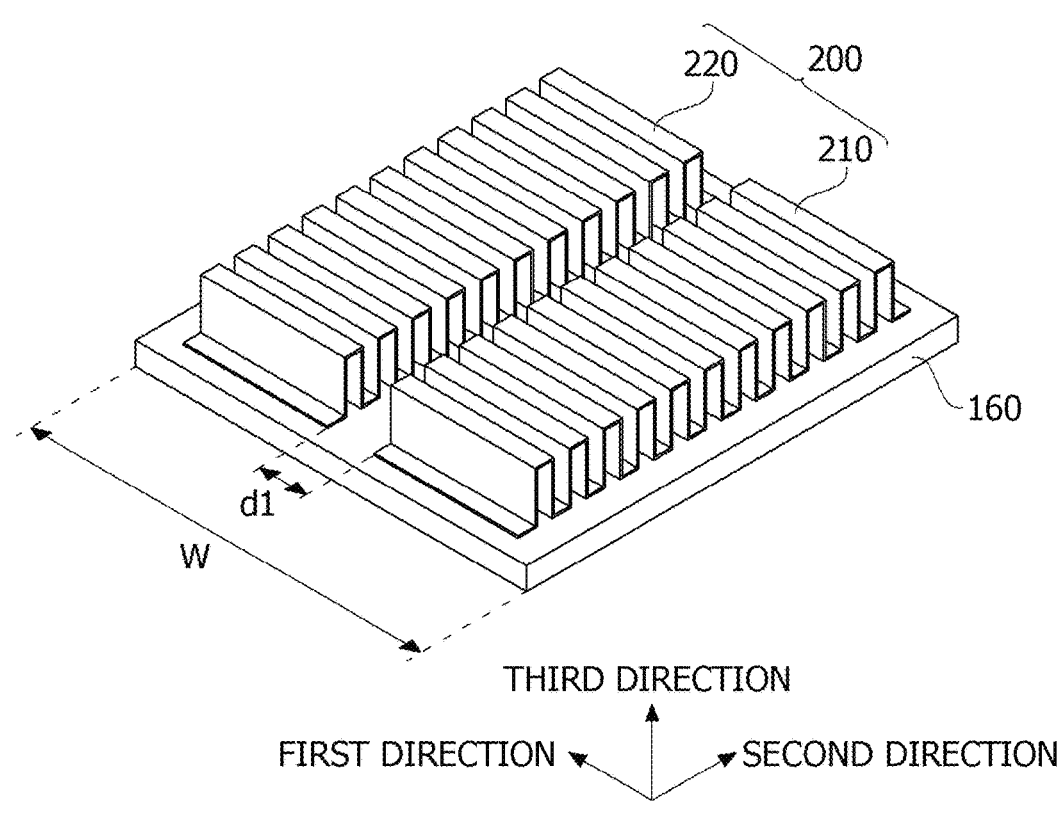
FIG. 17 is a perspective view of a second substrate and the heat sink of the thermoelectric module according to one embodiment of the present invention.
Figure 18:
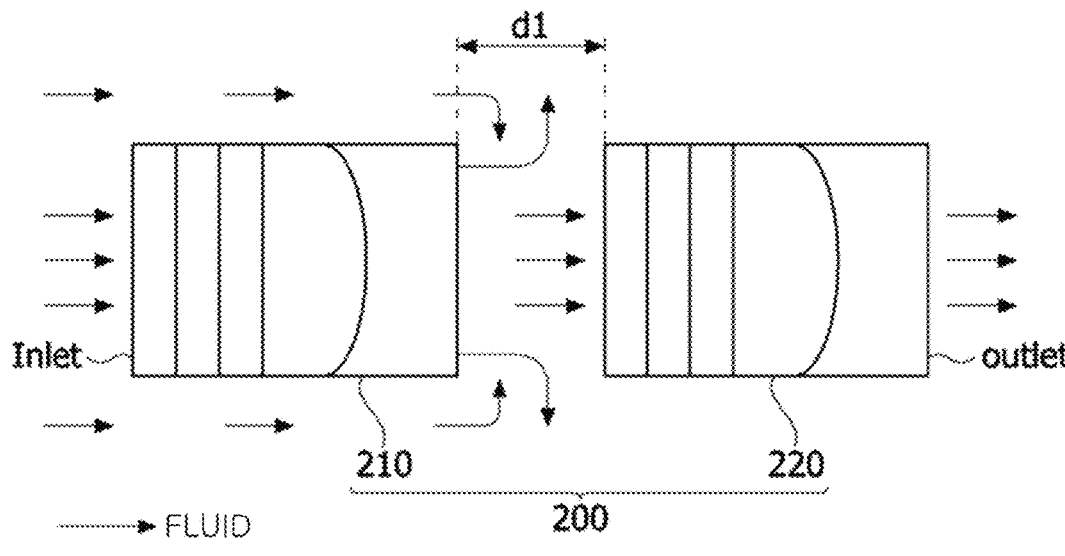
FIG. 18 illustrates a flow of a fluid in the heat sink of the thermoelectric module according to one embodiment of the present invention.

FIG. 17 is a perspective view of a second substrate and a heat sink of the thermoelectric module according to another embodiment of the present invention, and FIG. 18 illustrates a flow of a fluid in the heat sink of the thermoelectric module according to another embodiment of the present invention. In terms of the structure of the thermoelectric element, overlapping descriptions of the content the same as the content described with reference to FIGS. 1 to 4 will be omitted. The embodiments to be described below are described separately from the embodiments in FIGS. 6 to 13, but are not limited thereto, and may be combined with the embodiments in FIGS. 6 to 13.

Referring to FIG. 17, the heat sink 200 may include a plurality of heat sinks 210 and 220 disposed to be spaced apart from each other by a predetermined distance, and the fluid may pass through the plurality of heat sinks 210 and 220 along the first direction.

In this case, the plurality of heat sinks 210 and 220 may be disposed to be spaced apart from each other by a first distance d1 along the first direction, which is a direction in which the fluid flows. Here, for convenience of description, a first heat sink 210 and a second heat sink 220 disposed to be spaced apart from each other by the first distance d1 along the first direction, which is the direction in which the fluid flows, are shown, but the present invention is not limited thereto, and the plurality of heat sinks may include two or more heat sinks sequentially disposed to be spaced apart from each other by the first distance d1 along the first direction.

Although not shown, in one heat sink, the flow velocity of the fluid flowing in the middle region may be faster than the flow velocity of the fluid flowing in the edge region. The flow velocity difference may increase as the length of one heat sink according to the first direction, which is the direction in which the fluid flows, increases, and accordingly, heat exchange may not be efficiently performed.

In order to solve this problem, referring to FIG. 18, the plurality of heat sinks 210 and 220 may be disposed to be spaced apart from each other by the first distance d1 along the first direction, which is the direction in which the fluid flows. Accordingly, since an eddy of the fluid is generated in a separation region between the first heat sink 210 and the second heat sink 220, some of the fluid which passed through the first heat sink 210 may be discharged to the outside, and some of the external fluid may be introduced into the second heat sink 220 through the separation region between the first heat sink 210 and the second heat sink 220, and accordingly, heat exchange performance may be improved.

That is, at least some of the fluid which passed through the first heat sink 210, that is, at least some of the fluid of which a temperature is lowered compared to a case of introduction through heat exchange with the first heat sink 210 may be discharged to the outside through the separation region between the first heat sink 210 and the second heat sink 220. In this case, the fluid discharged to the outside may be a fluid which passed through the middle region of the first heat sink 200 at a faster speed. Further, in order to fill a space through which the fluid discharged to the outside through the separation region between the first heat sink 210 and the second heat sink 220 flows, a fluid having a higher temperature than the external fluid, that is, the fluid which passed through the first heat sink 210, may be introduced into the second heat sink 220 through the separation region between the first heat sink 210 and the second heat sink 220, and may be heat-exchanged through the second heat sink 220.

Accordingly, a high-temperature fluid is replenished through the separation region between the first heat sink 210 and the second heat sink 220, and as a result, since the pressure difference before the fluid passes through the first heat sink 210 and after the fluid passes through the second heat sink 220 may be reduced, the thermoelectric module may have uniform heat exchange performance as a whole regardless of the position of the fluid from an inlet to an outlet.

In this case, the first distance d1 between the first heat sink 210 and the second heat sink 220 according to the first direction may be 2.5 to 12.5%, preferably 3.5 to 11.5%, and more preferably 5 to 10% of a width W of the second substrate 160 in the first direction. When the first distance d1 is shorter than this value, it may not be easy for the inner fluid to be discharged to the outside, or the external fluid to be introduced into the inside through the separation space between the first heat sink 210 and the second heat sink 220. Further, when the first distance d1 is greater than this value, since an area of the heat sink capable of coming into contact with the fluid is reduced, heat exchange performance may be lowered.

Figure 19:
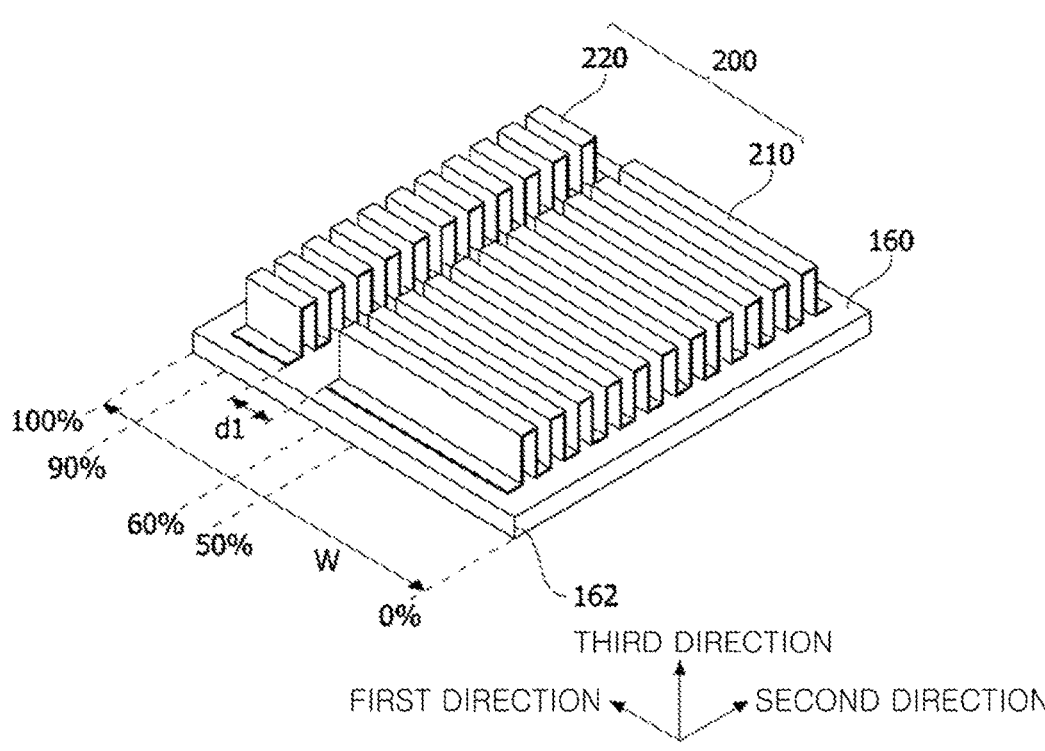
FIG. 19 is a perspective view of the second substrate and the heat sinks of the thermoelectric module according to another embodiment of the present invention.

FIG. 19 is a perspective view of the second substrate and the heat sinks of the thermoelectric module according to another embodiment of the present invention. Overlapping descriptions of the content the same as the above-described content will be omitted.

Referring to FIG. 19, the first heat sink 210 and the second heat sink 220 may be disposed to be spaced apart from each other by a first distance d1 along the first direction, which is the direction in which the fluid flows. In this case, an area of the first heat sink 210 may be different from an area of the second heat sink 220.

When the first heat sink 210 and the second heat sink 220 are sequentially disposed along the first direction, which is the direction of the fluid from the inlet toward the outlet, the area of the first heat sink 210 may be larger than the area of the second heat sink 220. That is, the separation region between the first heat sink 210 and the second heat sink 220 may be disposed between a point of 50% and a point of 100%, and more preferably, between a point of 60% and a point of 90% of the width W of the second substrate 160 based on one end 162 of the second substrate 160.

Generally, the pressure of the fluid may increase as the fluid approaches the outlet side from the inlet side. Specifically, the flow velocity of the fluid, viscosity of the fluid, a pitch P of the heat sink fins forming the heat sink, the length of the heat sink, or the like may affect the pressure difference of the fluid between the fluid inlet and the fluid outlet. In an application field in which the fluid at the inlet side is forced to flow to a region of the heat sink 200, fluid resistance increases as the pressure difference of the fluid between the fluid inlet and the fluid outlet is large, and accordingly, a fluid pressure in an adjacent region increases. Accordingly, some of the fluid which does not pass through the region of the heat sink 200 and thus is stagnant may flow backward and adversely affect a surrounding system, and the air which passed through the heat sink 200 may not satisfy an appropriate flow amount. Accordingly, in order to prevent efficiency deterioration of the thermoelectric module or a thermoelectric system to which the thermoelectric module is applied, the pressure difference before the fluid passes through the region of the heat sink 200 and after the fluid passes through the region of the heat sink 200 may be minimized. As in the embodiment of the present invention, when the separation region between the first heat sink 210 and the second heat sink 220 is disposed closer to the fluid outlet than the fluid inlet, the pressure difference of the fluid between the fluid inlet and the fluid outlet may be reduced, and accordingly, heat exchange efficiency may be further improved.

Meanwhile, the heat sink 200 may be bonded to the second substrate 160, and a high-temperature fluid may pass through the heat sink 200. Generally, a coefficient of thermal expansion of the heat sink 200 may be greater than a coefficient of thermal expansion of the second substrate 160, and accordingly, a shear stress may be applied to an interface between the heat sink 200 and the second substrate 160 and thus the thermoelectric module may be bent. In the embodiment of the present invention, the heat sink 200 may be divided to minimize the shear stress applied to the interface between the heat sink 200 and the second substrate 160.

Figure 20:
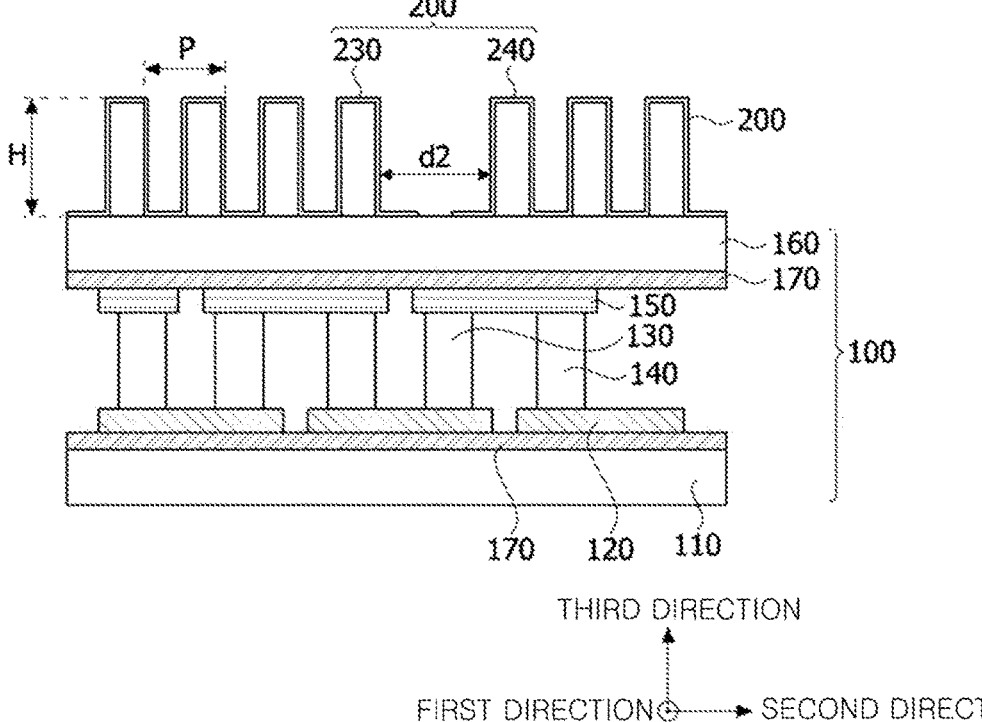
FIG. 20 is a cross-sectional view of a thermoelectric module according to still another embodiment of the present invention.
Figure 21:
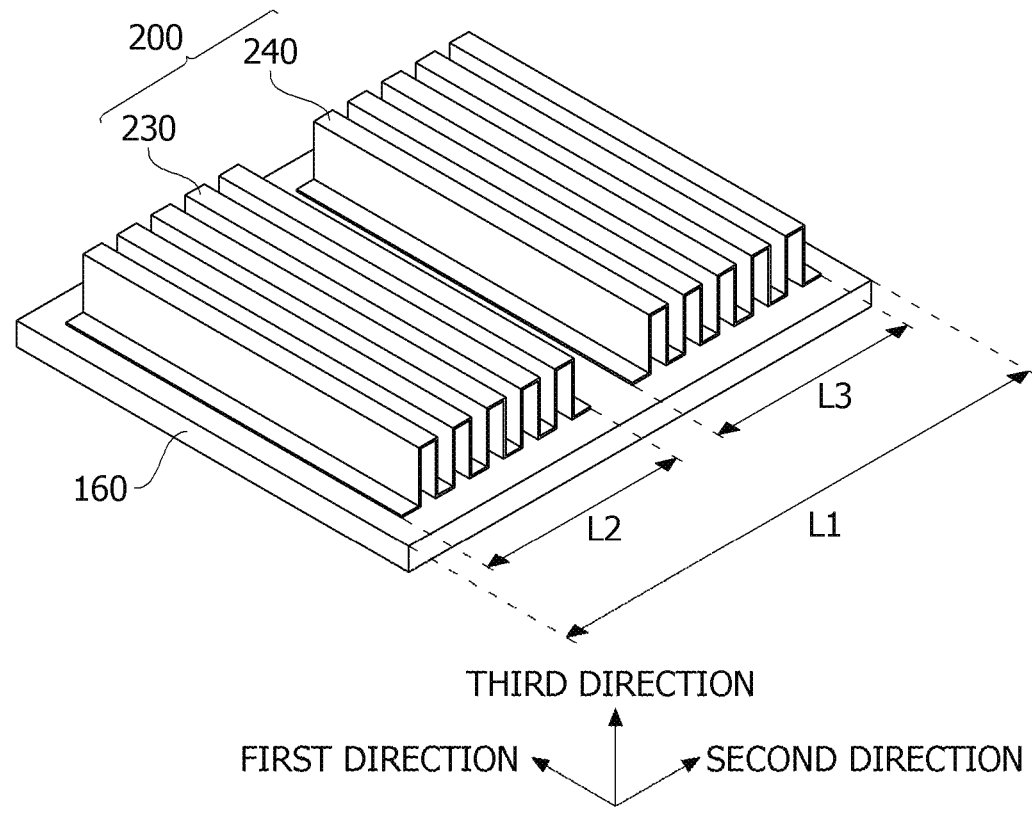
FIG. 21 is a perspective view of a second substrate and heat sinks of a thermoelectric module in FIG. 20.

FIG. 20 is a cross-sectional view of a thermoelectric module according to still another embodiment of the present invention, and FIG. 21 is a perspective view of a second substrate and heat sinks of the thermoelectric module in FIG. 20.

Referring to FIGS. 20 and 21, a plurality of heat sinks 230 and 240 may be disposed to be spaced apart from each other by a second distance d2 in a second direction perpendicular to the first direction, which is the direction in which the fluid flows.

Like the above, when the plurality of heat sinks 230 and 240 are disposed on one second substrate 160 to be spaced apart from each other, the shear stress applied to the interface between the second substrate 160 and the heat sink 200 due to a difference in the coefficient of thermal expansion between the second substrate 160 and the heat sink 200 may be minimized. That is, the shear stress applied to the second substrate 160 may depend on a product of the coefficient of thermal expansion of the second substrate 160 and a length difference of the second substrate 160, and the shear stress applied to the heat sink 200 may depend on a product of the coefficient of thermal expansion of the heat sink 200 and a length difference of the heat sink 200. Here, the length difference of the second substrate 160 may refer to a difference between a length L1 before thermal deformation of the second substrate 160 and a length after the thermal deformation, and the length difference of the heat sink 200 may refer to a difference between lengths L2 and L3 before thermal deformation of the heat sink 200 and lengths after the thermal deformation.

As in the embodiment of the present invention, in the case in which the heat sinks 200 are implemented as the plurality of heat sinks 230 and 240 disposed to be spaced apart from each other, the length difference of the heat sinks 200 may be reduced compared to a case in which the heat sink 200 is implemented as one along the second direction perpendicular to the first direction in which the fluid flows. Accordingly, even when the coefficient of thermal expansion of the heat sink 200 is greater than that of the second substrate 160, since the shear stress applied to the interface between the second substrate 160 and the heat sink 200 may be reduced, bending of the thermoelectric module may be prevented.

Figure 22:
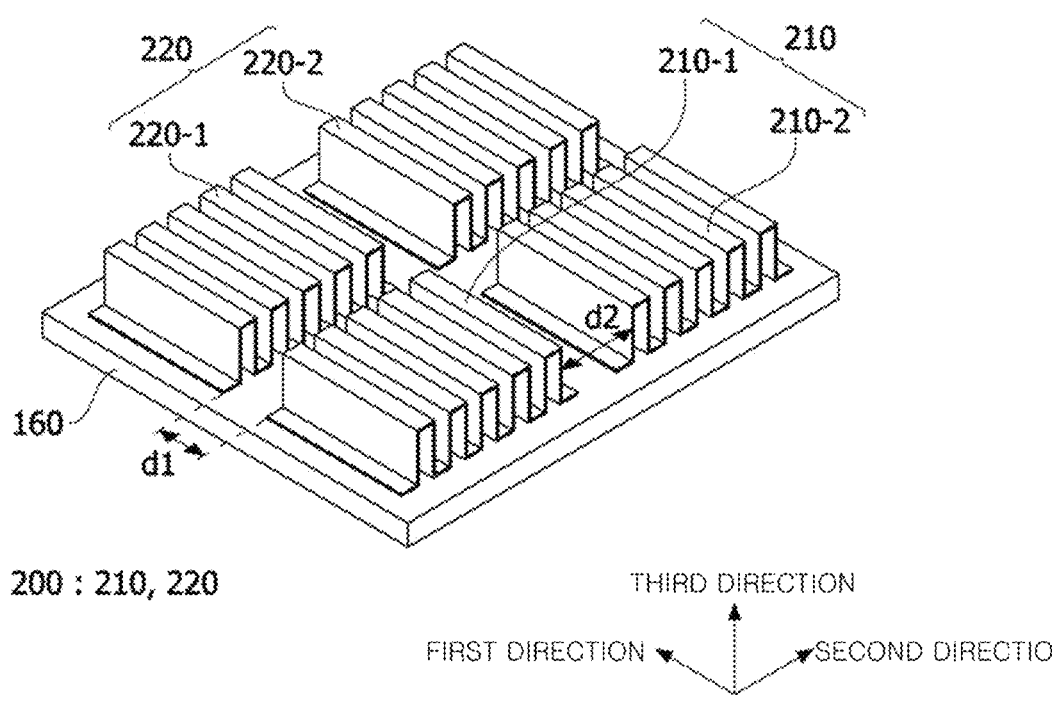
FIG. 22 is a perspective view of a second substrate and heat sinks of a thermoelectric module according to yet another embodiment of the present invention.
Figure 23:
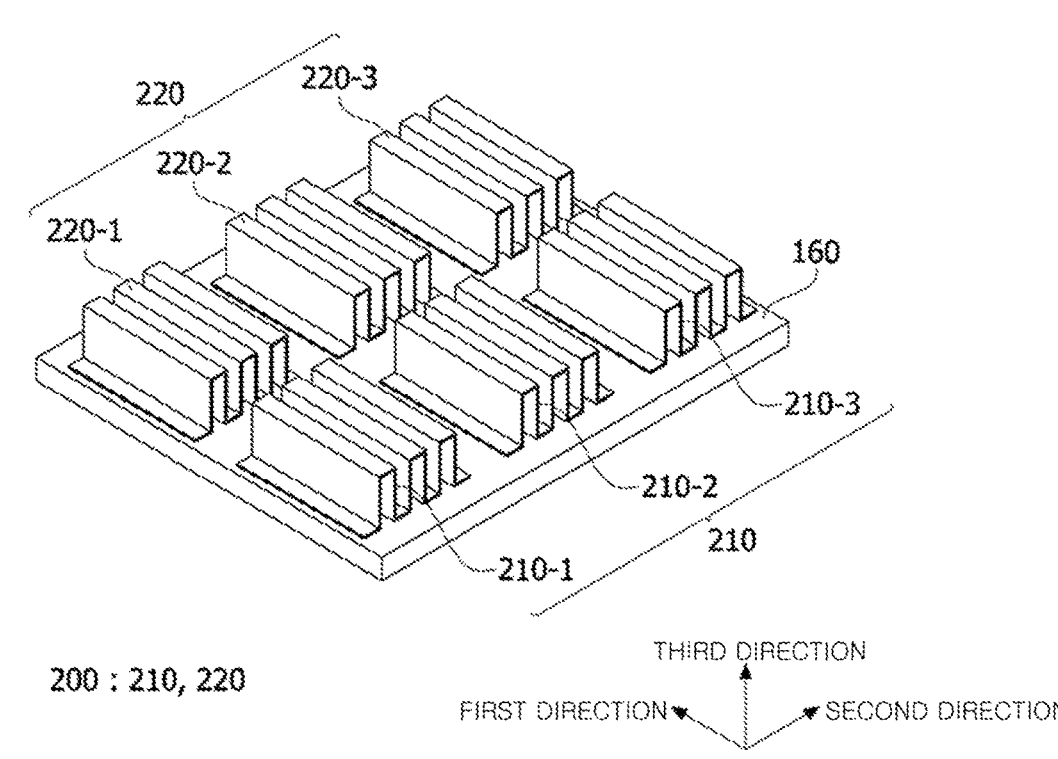
FIG. 23 is a perspective view of a second substrate and heat sinks of a thermoelectric module according to yet another embodiment of the present invention.

FIG. 22 is a perspective view of a second substrate and heat sinks of a thermoelectric module according to yet another embodiment of the present invention, and FIG. 23 is a perspective view of a second substrate and heat sinks of a thermoelectric module according to yet another embodiment of the present invention.

Referring to FIGS. 22 and 23, the heat sinks 200 may include a plurality of heat sinks spaced apart from each other by a first distance d1 along the first direction through which the fluid flows, and spaced apart from each other by a second distance d2 along the second direction perpendicular to the first direction.

For example, referring to FIG. 22, the heat sink 200 may include a first heat sink 210 and a second heat sink 220 disposed to be spaced apart from each other by the first distance d1 along the first direction in which the fluid flows, the first heat sink 210 may include a 1-1 heat sink 210-1 and a 1-2 heat sink 210-2 disposed to be spaced apart from each other by the second distance d2 along the second direction perpendicular to the first direction, and the second heat sink 220 may include a 2-1 heat sink 220-1 and a 2-2 heat sink 220-2 disposed to be spaced apart from each other by the second distance d2 along the second direction. Accordingly, both the heat exchange performance described through the embodiment according to FIGS. 17 to 19 and structural stability of the thermoelectric module described through the embodiment according to FIGS. 20 and 21 may be improved.

In this case, the first distance d1 may be greater than or equal to the second distance d2. Preferably, the first distance d1 may be 1.1 to 2.8 times the second distance d2. When the first distance d1 is smaller than 1.1 times the second distance d2, it may not be easy for the inner fluid to be discharged to the outside, or the external fluid to be introduced into the inside through the separation space between the first heat sink 210 and the second heat sink 220. Further, when the first distance d1 exceeds 2.8 times the second distance d2, since areas of the heat sinks which come into contact with the fluid are reduced, heat exchange performance may be lowered. Accordingly, a thermoelectric module with improved heat exchange performance and structural stability may be acquired.

Referring to FIG. 23, the heat sink 200 may include a first heat sink 210 and a second heat sink 220 disposed to be spaced apart from each other by a first distance d1 along the first direction in which the fluid flows, the first heat sink 210 may include a 1-1 heat sink 210-1, a 1-2 heat sink 210-2, and a 1-3 heat sink 210-3 disposed to be spaced apart from each other by a second distance d2 along the second direction perpendicular to the first direction, and the second heat sink 220 may include a 2-1 heat sink 220-1, a 2-2 heat sink 220-2, and a 2-3 heat sink 220-3 disposed to be spaced apart from each other by the second distance d2 along the second direction.

As such, the number and arrangement of the heat sinks 200 may be variously modified according to a size of the thermoelectric module.

In the above, embodiments in which a plurality of heat sinks are disposed on one second substrate 160 have been mainly described, but the present invention is not limited thereto.

Figure 24:
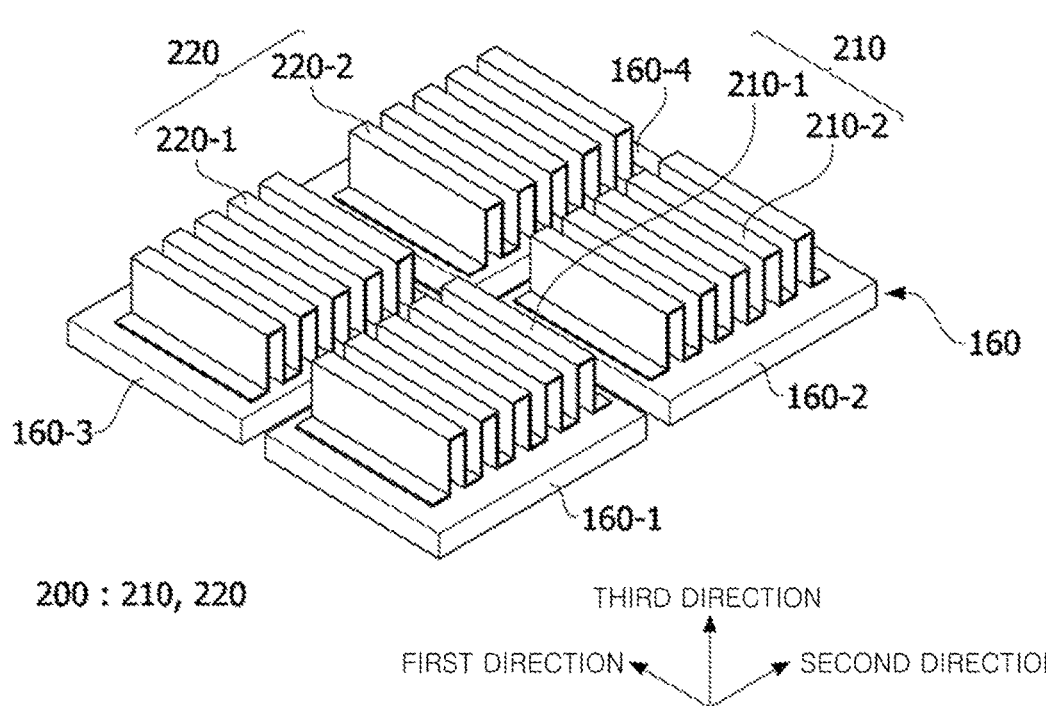
FIG. 24 is a perspective view of a second substrate and heat sinks of a thermoelectric module according to yet another embodiment of the present invention.

FIG. 24 is a perspective view of a second substrate and heat sinks of a thermoelectric module according to yet another embodiment of the present invention.

Referring to FIG. 24, the heat sink 200 may include a first heat sink 210 and a second heat sink 220 disposed to be spaced apart from each other by a first distance d1 along the first direction in which the fluid flows, the first heat sink 210 may include a 1-1 heat sink 210-1 and a 1-2 heat sink 210-2 disposed to be spaced apart from each other by a second distance d2 along the second direction perpendicular to the first direction, and the second heat sink 220 may include a 2-1 heat sink 220-1 and a 2-2 heat sink 220-2 disposed to be spaced apart from each other by the second distance d2 along the second direction. Accordingly, both the heat exchange performance described through the embodiment according to FIGS. 17 to 19 and the structural stability of the thermoelectric module described through the embodiment according to FIGS. 20 and 21 may be improved.

Meanwhile, generally, the heat sink may be disposed on a substrate at a high-temperature side, and due to a temperature difference between the substrate at the high-temperature side and the substrate at the low-temperature side, a shear stress applied to an interface between the substrate at the high-temperature side and an electrode and a shear stress applied to an interface between the substrate at the low-temperature side and an electrode may be different from each other. Accordingly, the thermoelectric module may be structurally bent, and durability of the thermoelectric module may be lowered.

In order to solve this problem, like the heat sink 200, the second substrate 160 may also include a plurality of sub-substrates 160-1, 160-2, 160-3, and 160-4 disposed to be spaced apart from each other, and at least one heat sink may be disposed on each sub-substrate. That is, the thermoelectric element may include a first substrate (not shown) and a second substrate 160, wherein the first substrate (not shown) may be a low-temperature side substrate, the second substrate 160 may be a high-temperature side substrate, and the second substrate 160 may include the plurality of sub-substrates 160-1, . . . , 160-4 with respect to one first substrate (not shown). Accordingly, a thermal deformation difference between the high-temperature side substrate and the low-temperature side substrate may be minimized.

Although not shown in the drawings, insulating structures may be disposed between the plurality of sub-substrates 160-1, 160-2, 160-3, and 160-4 disposed to be spaced apart from each other, or a shield structure may be disposed to cover all regions between the plurality of sub-substrates 160-1, 160-2, 160-3, and 160-4. The shield structure may be disposed to cover separation regions between the plurality of sub-substrates 160-1, 160-2, 160-3, and 160-4, or may be disposed to cover edges of the plurality of sub-substrates 160-1, 160-2, 160-3, and 160-4 at side surfaces of the heat sinks in addition to the regions between the plurality of sub-substrates 160-1, 160-2, 160-3, and 160-4. Accordingly, the regions between the plurality of sub-substrates 160-1, 160-2, 160-3, and 160-4 may be structurally and stably supported, and thermal deformation of the plurality of sub-substrates 160-1, 160-2, 160-3, and 160-4 may be alleviated. Further, the thermoelectric element may be sealed from external moisture, heat, contamination, and the like. Alternatively, each of the sub-substrates 160-1, . . . , 160-4 may be coupled to the first substrate (not shown) through a coupling member.

Figure 25:
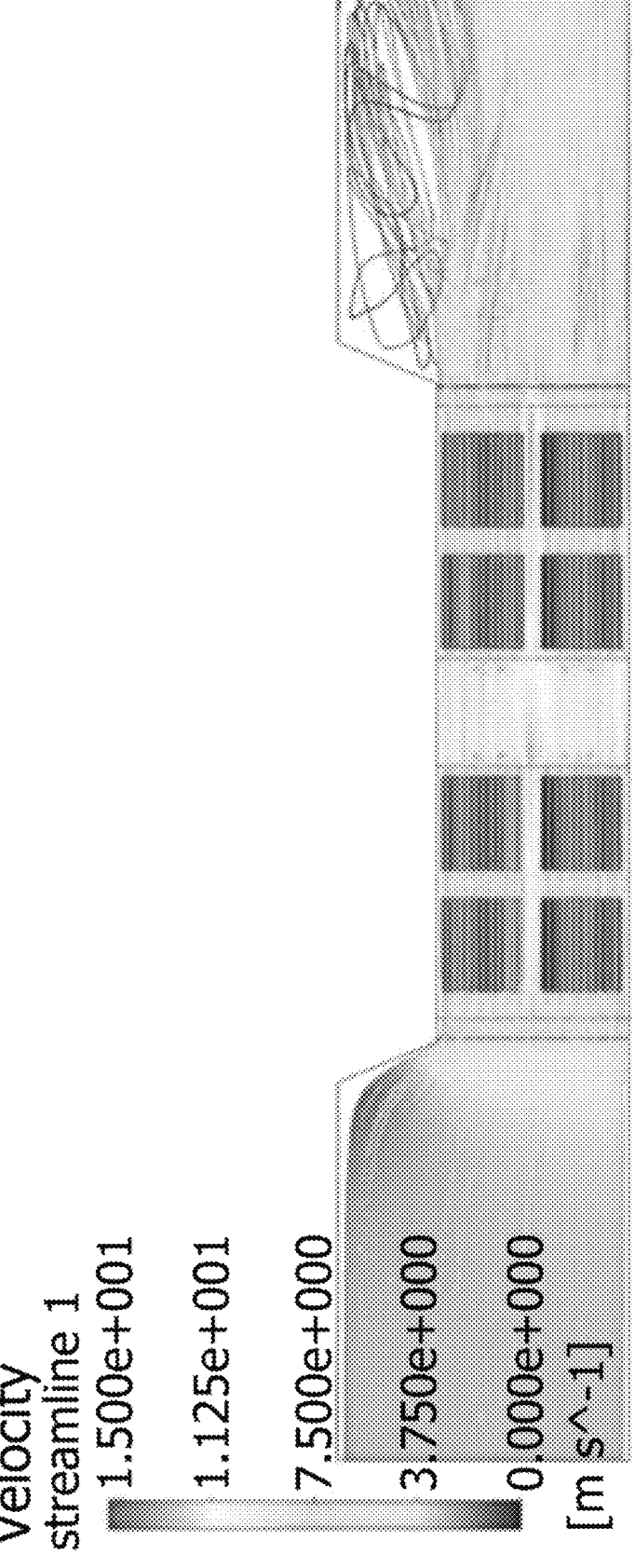
FIG. 25 is a simulation result of the flow of fluid in the thermoelectric module according to the embodiment.
Figure 26:
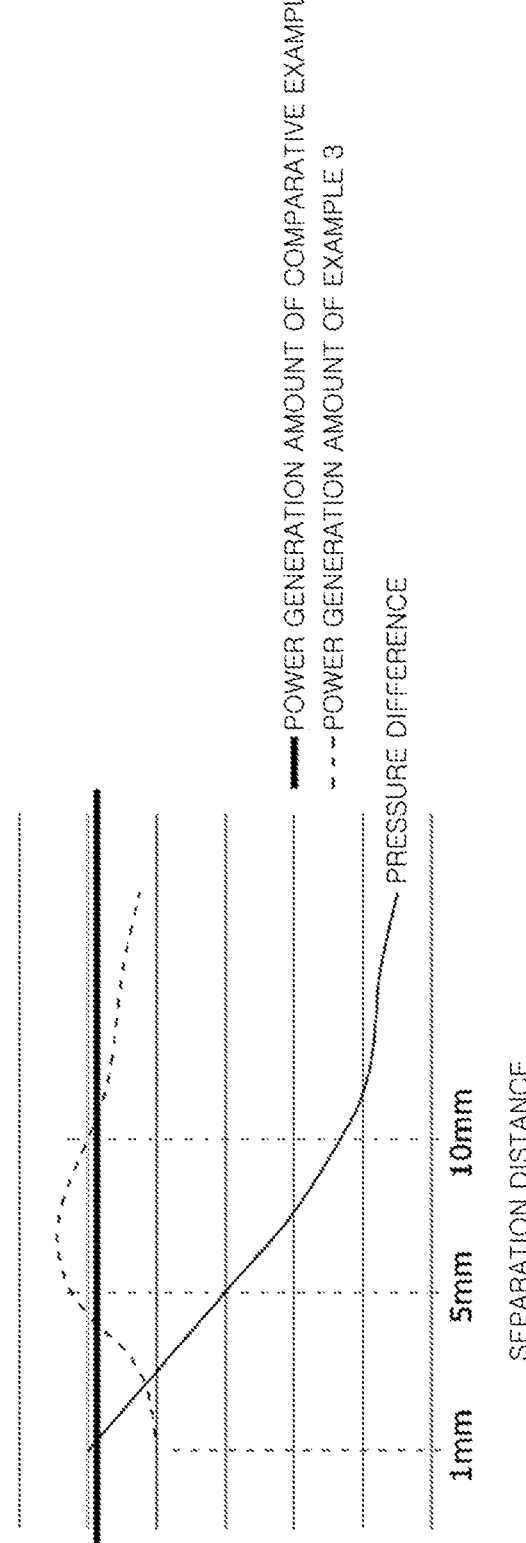
FIG. 26 is a graph of comparing power generation amounts for thermoelectric modules according to the embodiment and a comparative example and a pressure difference of the fluid.

FIG. 25 is a simulation result of the flow of fluid in the thermoelectric module according to the embodiment, and FIG. 26 is a graph of comparing power generation amounts for the thermoelectric module according to the embodiment and a comparative example and a pressure difference of the fluid.

In the thermoelectric module according to the embodiment, the second substrate has a size of 100 mm*100 mm, and four heat sinks were disposed on the second substrate to be spaced apart from each other by a first distance d1 and a second distance d2.

In the thermoelectric module according to the comparative example, the second substrate has a size of 100 mm*100 mm, and a single heat sink was disposed on the second substrate.

Two thermoelectric modules according to the embodiment and two thermoelectric modules according to the comparative example were disposed, and fluid was allowed to pass therethrough.

Referring to FIG. 25, in the thermoelectric module according to the embodiment, it can be seen that the pressure difference between fluid inlet and the fluid outlet is not large.

Further, referring to FIG. 26, in the thermoelectric module according to the embodiment, it can be seen that the pressure difference between the fluid inlet and the fluid outlet decreases as the separation distance between the heat sinks along the first direction in which the fluid flows increases, and when the distance between the heat sinks is 2.5 to 12.5 mm, it can be seen that a higher power generation amount is acquired compared to the thermoelectric module according to the comparative example.

In addition, the embodiments according to the present invention may be combined in various ways.

The above-described thermoelectric modules according to the embodiments of the present invention may be applied to a thermal conversion device.

Figure 27:
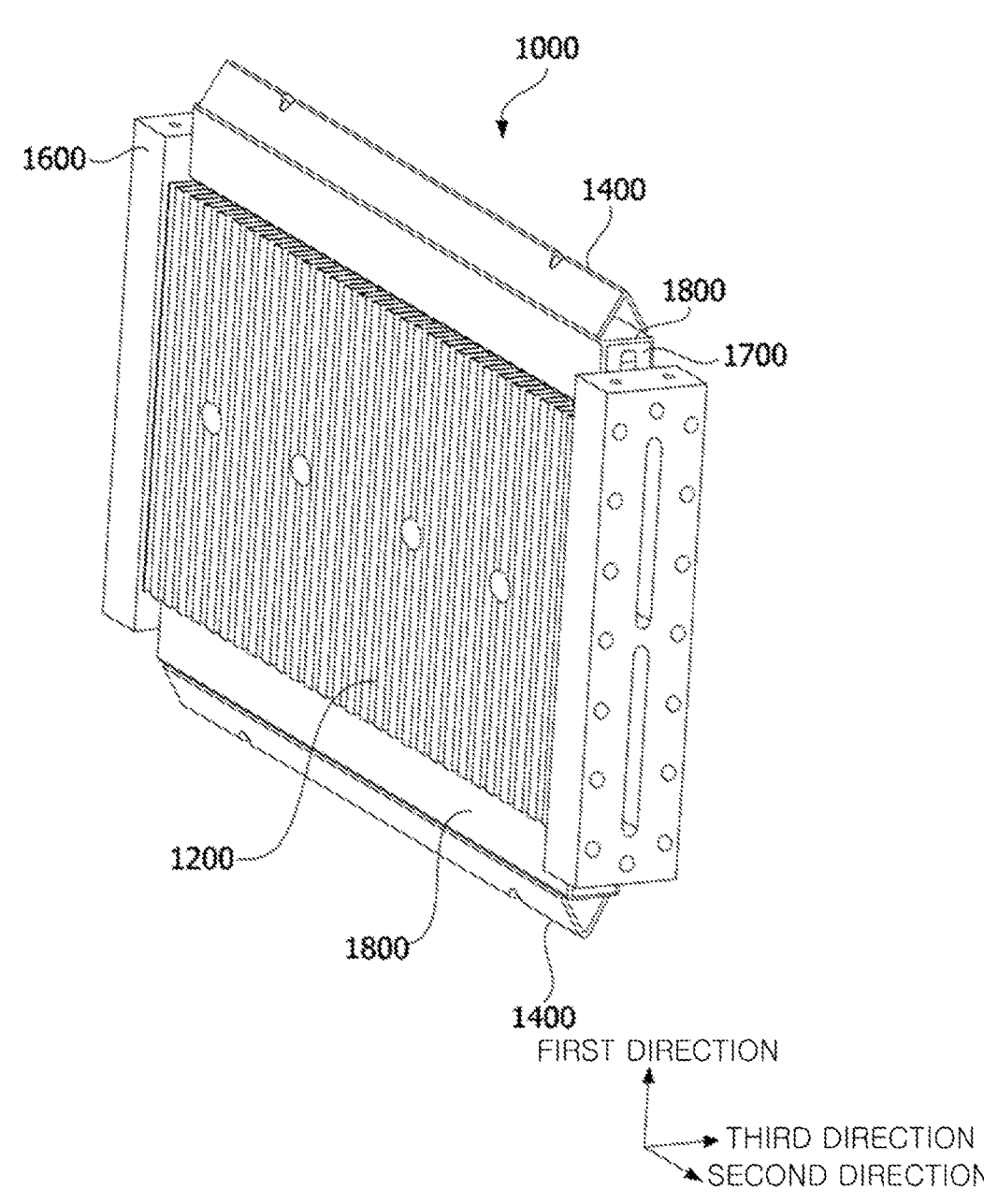
FIG. 27 is a perspective view of an example of a thermal conversion device to which the thermoelectric module according to the embodiment of the present invention is applied.
Figure 28:
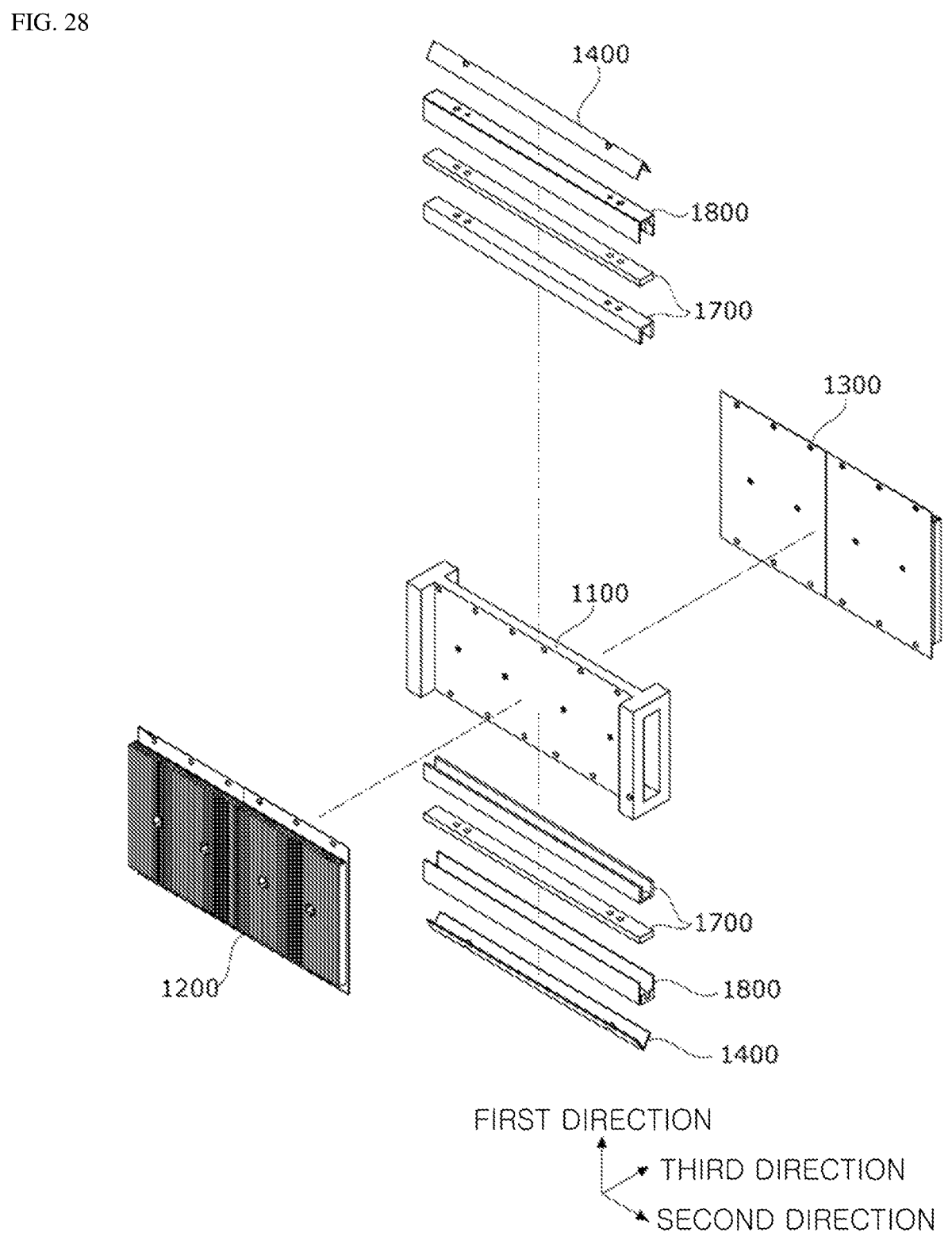

FIG. 27 is a perspective view of an example of the thermal conversion device to which the thermoelectric module according to the embodiment of the present invention is applied, and FIG. 28 is an exploded perspective view of the thermal conversion device in FIG. 27.

Figure 29:
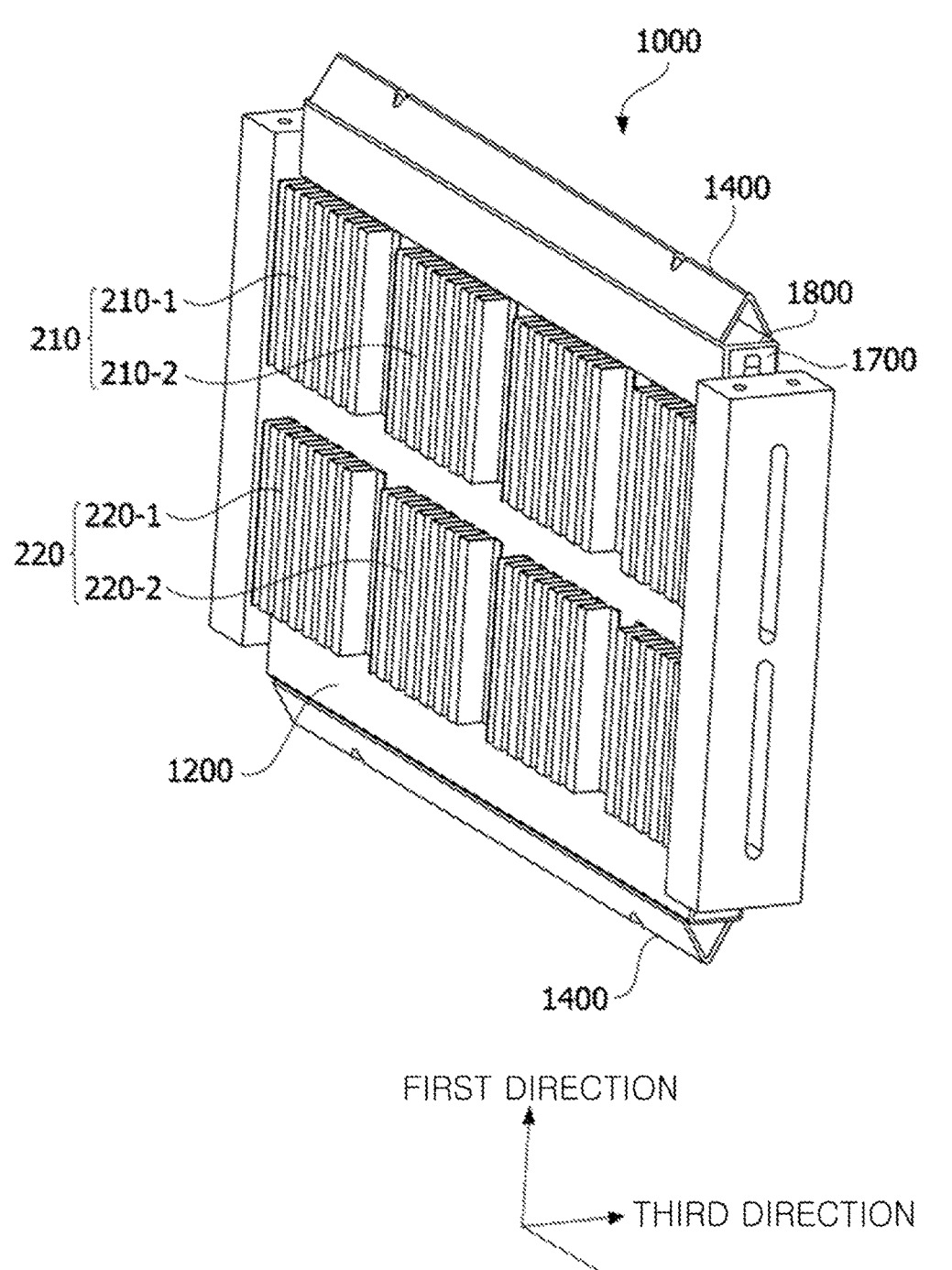
FIG. 29 is a perspective view of another example of the thermal conversion device to which the thermoelectric module according to the embodiment of the present invention is applied.
Figure 30:
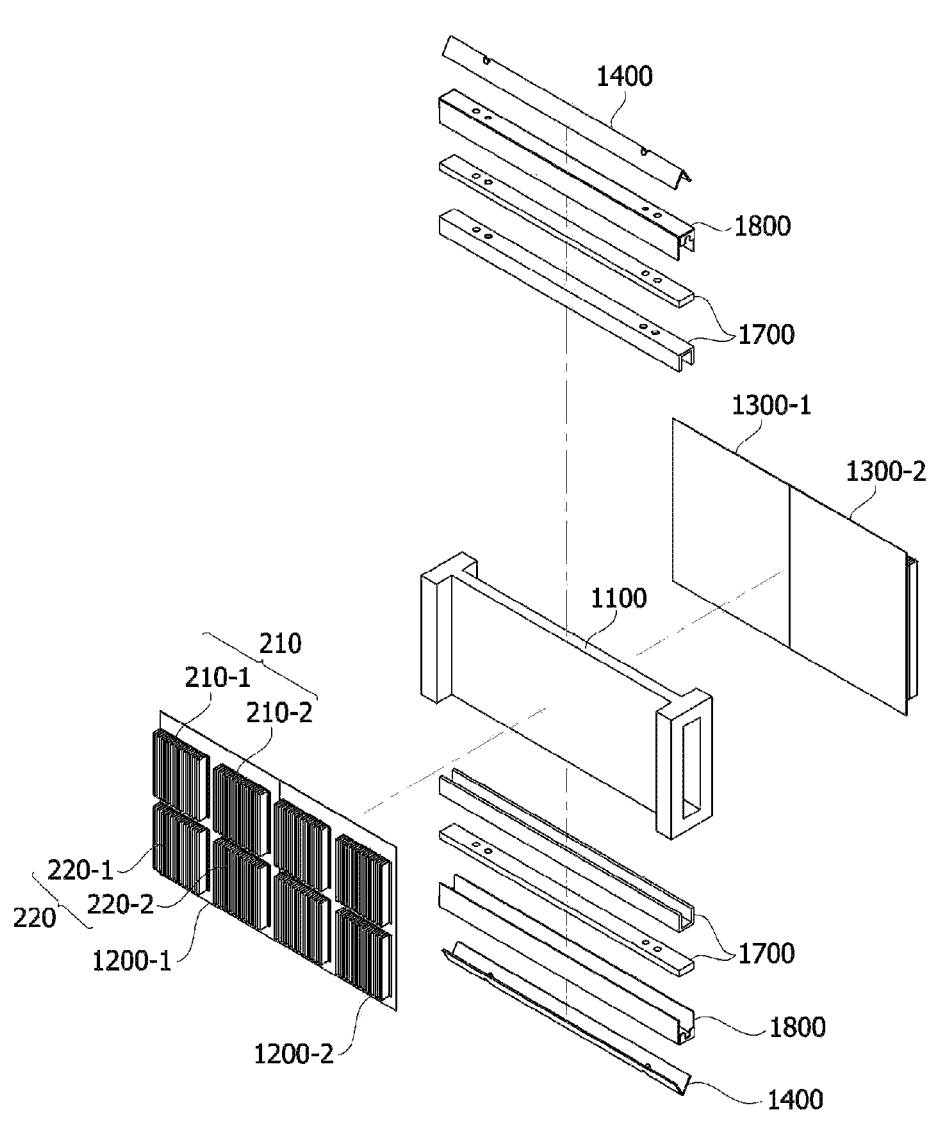
FIG. 30 is an exploded perspective view of the thermal conversion device in FIG. 29.

FIG. 29 is a perspective view of another example of the thermal conversion device to which the thermoelectric module according to the embodiment of the present invention is applied, and FIG. 30 is an exploded perspective view of the thermal conversion device in FIG. 29.

Referring to FIGS. 17 to 30, a thermal conversion device 1000 includes a duct 1100, a first thermoelectric module 1200, a second thermoelectric module 1300, and a gas guide member 1400. Here, the thermal conversion device 1000 may generate power using a temperature difference between a cooling fluid flowing through the inside of the duct 1100 and a high-temperature gas passing through the outside of the duct 1100.

To this end, the first thermoelectric module 1200 may be disposed on one surface of the duct 1100, and the second thermoelectric module 1300 may be disposed on the other surface of the duct 1100. In this case, a surface disposed to face the duct 1100 among both surfaces of each of the first thermoelectric module 1200 and the second thermoelectric module 1300 becomes a low-temperature portion, and power may be produced using a temperature difference between the low-temperature portion and a high-temperature portion. The thermoelectric module according to the embodiment of the present invention may be applied to the first thermoelectric module 1200 or the second thermoelectric module 1300.

The cooling fluid introduced into the duct 1100 may be water, but is not limited thereto, and may be various types of fluids having cooling performance. A temperature of the cooling fluid introduced into the duct 1100 may be lower than 100° C., preferably, lower than 50° C., and more preferably, lower than 40° C., but is not limited thereto. A temperature of the cooling fluid which is discharged after passing through the duct 1100 may be higher than the temperature of the cooling fluid introduced into the duct 1100.

The cooling fluid is introduced from a cooling fluid inlet of the duct 1100 and discharged through a cooling fluid outlet.

Although not shown in the drawings, heat dissipation fins may be disposed on an inner wall of the duct 1100. The shape, number, and area occupying the inner wall of the duct 1100 of the heat dissipation fins may be variously changed according to the temperature of the cooling fluid, a temperature of the waste heat, a required power generation capacity, and the like.

Meanwhile, the first thermoelectric module 1200 is disposed on one side of the duct 1100, and the second thermoelectric module 1300 is disposed on the other side of the duct 1100 to be symmetrical to the first thermoelectric module 1200.

Here, the first thermoelectric module 1200 and the second thermoelectric module 1300 disposed symmetrically to the first thermoelectric module 1200 may be referred to as a pair of thermoelectric modules or unit thermoelectric modules. Each of the first thermoelectric module 1200 and the second thermoelectric module 1300 may include a thermoelectric module according to the embodiment of the present invention. For example, each of the first thermoelectric module 1200 and the second thermoelectric module 1300 may include the thermoelectric element 100 according to the embodiment of the present invention and a plurality of heat sinks 200 disposed on the second substrate 160 of the thermoelectric element 100 to be spaced apart from each other, and the first substrate 110 of the thermoelectric element 100 may be disposed to face the duct 1100. In the present specification, the duct 1100 may be referred to as a first fluid flow portion, and the heat sink 200 may be referred to as a second fluid flow portion.

The gas guide member 1400, a sealing member 1800, and an insulating member 1700 may be further disposed on the duct 1100 in a direction in which air flows.

However, examples to which the thermoelectric module according to the embodiment of the present invention is applied are not limited thereto.

The thermoelectric module according to the embodiment of the present invention may be applied to a device for power generation, a device for cooling, a device for heating, and the like. Specifically, the thermoelectric module according to the embodiment of the present invention may be mainly applied to an optical communication module, a sensor, a medical device, a measuring device, the aerospace industry, a refrigerator, a chiller, a ventilated car seat, a cup holder, a washing machine, a dryer, a wine cellar, a water purifier, a power supply device for a sensor, a thermopile, and the like.

In addition, the thermoelectric module according to the embodiment of the present invention may be applied to other industrial fields for power generation, cooling, and heating.

Although preferable embodiments of the present invention are described above, those skilled in the art may variously modify and change the present invention within the scope of the spirit and scope of the present invention disclosed in the claims which will be described below.

The invention claimed is:

1. A thermoelectric module comprising:
a first substrate;
a first electrode disposed on the first substrate;
a semiconductor structure disposed on the first electrode;
a second electrode disposed on the semiconductor structure;
a second substrate disposed on the second electrode; and
a heat sink disposed on the second substrate,
wherein the heat sink has a shape in which predetermined patterns are connected while being regularly repeated,
wherein each of the patterns includes;
a first surface disposed on the second substrate,
a second surface connected to the first surface and disposed in a direction perpendicular to the second substrate,
a third surface connected to the second surface and disposed to face the second substrate, and
a fourth surface connected to the third surface, perpendicular to the second substrate, and disposed to face the second surface,
wherein the heat sink includes a pair of protrusions disposed to face each other symmetrically on the second surface and the fourth surface with respect to a direction for a fluid to pass through in a region formed by the second surface, the third surface, the fourth surface and the second substrate,
wherein a length of each of the pair of protrusions according to the direction for the fluid to pass through is 4 to 10% of a length of each of the second surface and the fourth surface,
wherein a thickness of the each of the pair of protrusions according to a direction perpendicular to the direction for the fluid to pass through and parallel to the second substrate is 10 to 20% of a distance between the second surface and the fourth surface,
wherein a height of each of the pair of protrusions according to a direction perpendicular to the second substrate is 30 to 50% of a distance between the second substrate and the third surface, and
wherein the thickness of each of the pair of protrusions becomes thinner along the direction for the fluid to pass.

2. The thermoelectric module of claim 1, wherein the length of each of the pair of protrusions according to the direction for the fluid to pass through is smaller than a length of the heat sink according to the direction for the fluid to pass through.

3. The thermoelectric module of claim 1, wherein:
the first surface, the second surface, the third surface, and the fourth surface are an integrated flat plate having a sequentially folded structure,
the distance between the second substrate and the third surface is greater than a distance between the second substrate and the first surface;

each of the first surface, the second surface, the third surface and the fourth surface extends along the direction for the fluid to pass through.

4. The thermoelectric module of claim 3, wherein:
the pair of protrusions are disposed on the second surface, and the fourth surface for each of the patterns.

5. The thermoelectric module of claim 4, wherein another pair of protrusions respectively disposed on the second surface and the fourth surface at the outside of the region formed by the second surface, the third surface, the fourth surface, and the second substrate is disposed to be symmetrical to each other with respect to the direction for the fluid to pass through.

6. The thermoelectric module of claim 3, further comprising an adhesive layer disposed between the second substrate and the first surface.

7. The thermoelectric module of claim 1, wherein:
the heat sink includes a plurality of sub-heat sinks disposed on the second substrate to be spaced apart from each other by a predetermined distance;
the plurality of sub-heat sinks are disposed to be spaced apart from each other by a first distance in a first direction which is the direction for the fluid to pass through; and
the first distance is 2.5 to 12.5% of a width of the second substrate in the first direction.

8. The thermoelectric module of claim 7, wherein the plurality of sub-heat sinks includes a first sub-heat sink and a second sub-heat sink disposed to be spaced apart from each other by the first distance in the first direction, and an area of the first sub-heat sink is different from an area of the second sub-heat sink.

9. The thermoelectric module of claim 8, wherein a separation region between the first sub-heat sink and the second sub-heat sink is disposed between a point of 50% and a point of 100% of a width of the second substrate based on one end of the second substrate.

10. The thermoelectric module of claim 7, wherein the plurality of sub-heat sinks includes a first sub-heat sink and a second sub-heat sink spaced apart from each other by the first distance in the first direction, the first sub-heat sink includes a 1-1 sub-heat sink and a 1-2 sub-heat sink disposed to be spaced apart from each other by a second distance in a second direction perpendicular to the first direction, and the second sub-heat sink includes a 2-1 sub-heat sink and a 2-2 sub-heat sink disposed to be spaced apart from each other by the second distance in the second direction.

11. The thermoelectric module of claim 10, wherein the first distance is greater than the second distance.

12. A power generation device comprising:
a first fluid flow unit;
a thermoelectric element disposed on the first fluid flow unit; and
a second fluid flow unit disposed on the thermoelectric element,
wherein the thermoelectric element includes a first substrate disposed on the first fluid flow unit, a first electrode disposed on the first substrate, a semiconductor structure disposed on the first electrode, a second electrode disposed on the semiconductor structure, and a second substrate disposed on the second electrode, the second fluid flow unit includes a heat sink disposed on the second substrate,
wherein the heat sink has a shape in which predetermined patterns are connected while being regularly repeated,
wherein each of the patterns includes a first surface disposed on the second substrate, a second surface connected to the first surface and disposed in a direction perpendicular to the second substrate, a third surface connected to the second surface and disposed to face the second substrate, and a fourth surface connected to the third surface, perpendicular to the second substrate, and disposed to face the second surface,
wherein the heat sink includes a pair of protrusions disposed to face each other symmetrically on the second surface and the fourth surface with respect to a direction for a fluid to pass through in a region formed by the second surface, the third surface, the fourth surface and the second substrate,
wherein a length of each of the pair of protrusions according to the direction for the fluid to pass through is 4 to 10% of a length of each of the second surface and the fourth surface,
wherein a thickness of each of the pair of protrusions according to a direction perpendicular to the direction for the fluid to pass through and parallel to the second substrate is 10 to 20% of a distance between the second surface and the fourth surface,
wherein a height of each of the pair of protrusions according to a direction perpendicular to the second substrate is 30 to 50% of a distance between the second substrate and the third surface, and
wherein the thickness of each of the pair of protrusions becomes thinner along the direction for the fluid to pass.

* * * * *